US012745684B2

(12) United States Patent
Yim et al.

(10) Patent No.: US 12,745,684 B2
(45) Date of Patent: Sep. 22, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Choongbin Yim, Suwon-si (KR); Ji-Yong Park, Suwon-si (KR); Jin-Woo Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 526 days.

(21) Appl. No.: 18/174,992

(22) Filed: Feb. 27, 2023

(65) Prior Publication Data

US 2023/0402358 A1 Dec. 14, 2023

(30) Foreign Application Priority Data

Jun. 13, 2022 (KR) ........................ 10-2022-0071776

(51) Int. Cl.

| | |
|---|---|
| ***H01L 23/498*** | (2006.01) |
| ***H10W 74/10*** | (2026.01) |
| ***H10W 90/00*** | (2026.01) |
| *H10W 70/09* | (2026.01) |
| *H10W 70/60* | (2026.01) |

(52) U.S. Cl.

CPC ........ *H10W 90/701* (2026.01); *H10W 74/111* (2026.01); *H10W 70/09* (2026.01); *H10W 70/60* (2026.01); *H10W 90/00* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 7,038,144 | B2 | 5/2006 | Yasuda et al. | |
| 9,484,331 | B2 | 11/2016 | Paek et al. | |
| 9,875,969 | B2 | 1/2018 | Braunisch et al. | |
| 10,679,930 | B2 * | 6/2020 | Lee | H01L 23/488 |
| 11,854,948 | B2 * | 12/2023 | Kim | H01L 25/0657 |
| 2005/0104222 | A1 | 5/2005 | Jeong et al. | |
| 2013/0264708 | A1 | 10/2013 | Hiwatashi | |

(Continued)

FOREIGN PATENT DOCUMENTS

| | | | |
|---|---|---|---|
| JP | 2007-027576 | A | 2/2007 |
| KR | 1020070052043 | A | 5/2007 |

(Continued)

*Primary Examiner* — Long Pham

(74) *Attorney, Agent, or Firm* — Wolf, Greenfield & Sacks, P.C.

(57) ABSTRACT

A semiconductor package includes a package substrate, substrate pads provided on a top surface of the package substrate, at least one core ball on at least one of the substrate pads, a redistribution substrate provided on the top surface of the package substrate, and a semiconductor chip mounted on the redistribution substrate. The redistribution substrate is electrically connected to the package substrate through a plurality of solder balls provided on a bottom surface of the redistribution substrate. The at least one core ball is electrically connected to the redistribution substrate. A diameter of the at least one core ball is greater than a diameter of each of the plurality of solder balls.

20 Claims, 19 Drawing Sheets

10A

(56) References Cited

U.S. PATENT DOCUMENTS

| | | | | |
|---|---|---|---|---|
| 2014/0151863 | A1 | 6/2014 | Kim et al. | |
| 2022/0059437 | A1* | 2/2022 | Kim | H01L 23/562 |
| 2022/0415809 | A1 | 12/2022 | Kim et al. | |
| 2023/0035026 | A1* | 2/2023 | Kim | H01L 23/49816 |

FOREIGN PATENT DOCUMENTS

| | | | |
|---|---|---|---|
| KR | 1020160026168 | A | 3/2016 |
| KR | 10-2021-0126228 | A | 10/2021 |
| KR | 10-2022-0022602 | A | 2/2022 |
| KR | 1020230000725 | A | 1/2023 |
| KR | 1020230018090 | | 2/2023 |

* cited by examiner 10D
30
20
870
840
830
850
811
810
750
755
701
720
725
700
112
200D
1100
1000
1200
1300
800
102
101
450
330
775
722
721
720
650
500
111
201
220
200
301
420
D1
D3

10E
31
21
840
830
811
810
800
750
755
701
720
725
700
112
102
101
111
200D
1100
1000
1200
1300
450
330
420
301
220
201
651
690
650
610
652
721
722
720
600
200
775
D1
D3

SEMICONDUCTOR PACKAGE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2022-0071776, filed on Jun. 13, 2022, in the Korean Intellectual Property Office, the entire contents of which are hereby incorporated by reference.

BACKGROUND OF THE INVENTION

The present disclosure relates to a semiconductor package and a method of manufacturing the same.

Portable devices have been increasingly in demand in the electronics market, and thus high-performance, small and light electronic components mounted in the electronics are desirable. In particular, high-performance semiconductor memory devices have been increasingly in demand, and for example, semiconductor memory devices having high bandwidths and/or high processing capacities.

A semiconductor package technique of integrating a plurality of individual components in a single package as well as a technique of reducing a size of an individual component may be used to provide small and light electronic components. In particular, it may be desirable to provide a semiconductor package of processing a high-frequency signal with excellent electrical characteristics as well as a small size.

SUMMARY

Embodiments of the inventive concepts may provide a semiconductor package with improved structural stability.

Embodiments of the inventive concepts may also provide a semiconductor package with improved electrical characteristics.

Embodiments of the inventive concepts may further provide a small semiconductor package.

In an aspect, a semiconductor package may include a package substrate, a plurality of substrate pads on a top surface of the package substrate, at least one core ball on at least one of the plurality of substrate pads, a redistribution substrate on the top surface of the package substrate, and a semiconductor chip mounted on the redistribution substrate. The redistribution substrate may be electrically connected to the package substrate through a plurality of solder balls on a bottom surface of the redistribution substrate. The at least one core ball may be electrically connected to the redistribution substrate. A diameter of the at least one core ball may be greater than a diameter of each of the plurality of solder balls.

In an aspect, a semiconductor package may include a package substrate, a semiconductor chip on the package substrate, a redistribution substrate between the package substrate and the semiconductor chip, a plurality of first solder balls and a plurality of second solder balls between the redistribution substrate and the package substrate, and a plurality of under bump pads between the redistribution substrate and the first plurality of solder balls. The redistribution substrate may be electrically connected to the package substrate through the first plurality of first solder balls, the plurality of second solder balls and the plurality of under bump pads. A diameter of each of the plurality of second solder balls may be greater than a diameter of each of the plurality of first solder balls.

In an aspect, a semiconductor package may include a package substrate, a plurality of substrate pads on a top surface of the package substrate, a semiconductor chip on the package substrate, the semiconductor chip comprising a plurality of chip pads on a bottom surface of the semiconductor chip, a redistribution substrate between the package substrate and the semiconductor chip, the redistribution substrate electrically connected to the plurality of chip pads, a plurality of under bump pads and a plurality of ball pads on a bottom surface of the redistribution substrate, a plurality of solder balls on respective bottom surfaces of the plurality of under bump pads, and a plurality of core balls on respective bottom surfaces of the plurality of ball pads. The plurality of solder balls and the plurality of core balls may be connected to the substrate pads of the package substrate. The redistribution substrate may be electrically connected to the package substrate through the plurality of solder balls and the plurality of core balls. The plurality of core balls may be on corners of the bottom surface of the redistribution substrate. The plurality of solder balls may be between at least two of the plurality of core balls. A diameter of each of the plurality of core balls may be greater than a diameter of each of the plurality of solder balls.

DETAILED DESCRIPTION

Figure 1:
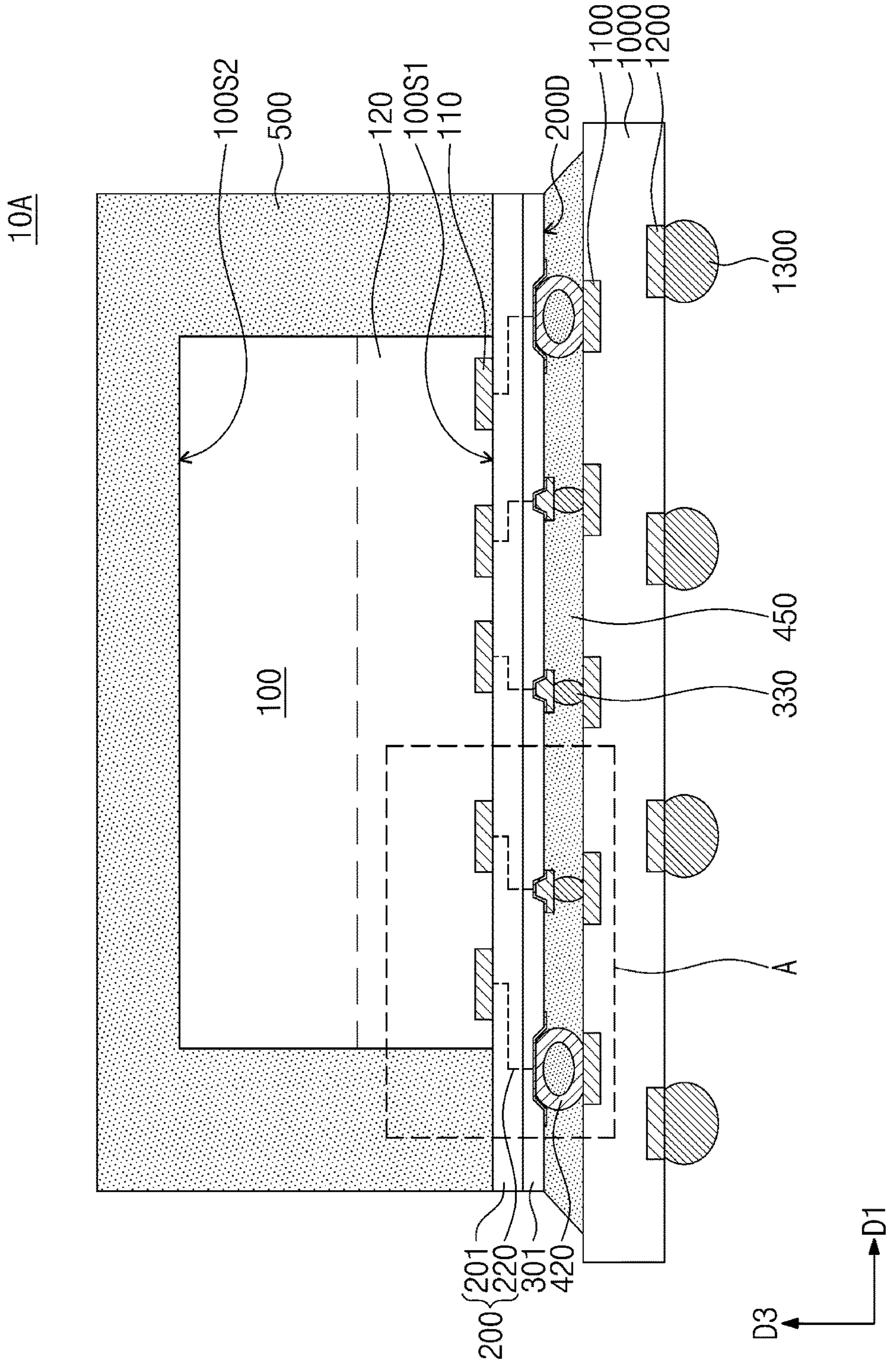
FIG. 1 is a cross-sectional view illustrating a semiconductor package according to some embodiments of the inventive concepts.

The same reference numerals or the same reference designators may denote the same elements or components throughout the specification. In the present specification, it may be understood that when a component is referred to as being on another component, it may be on at least one of a top surface, a bottom surface and a side surface of the other component. When a component is referred to as being on another component, it may be directly on the other component or there may be one or more other intervening components. A component that is directly on another component may be contacting the component. A semiconductor package and a method of manufacturing the same according to the inventive concepts will be described hereinafter.

Hereinafter, embodiments of the inventive concepts will be described in detail with reference to the accompanying drawings.

FIG. 1 is a cross-sectional view illustrating a semiconductor package according to some embodiments of the inventive concepts.

Figure 2:
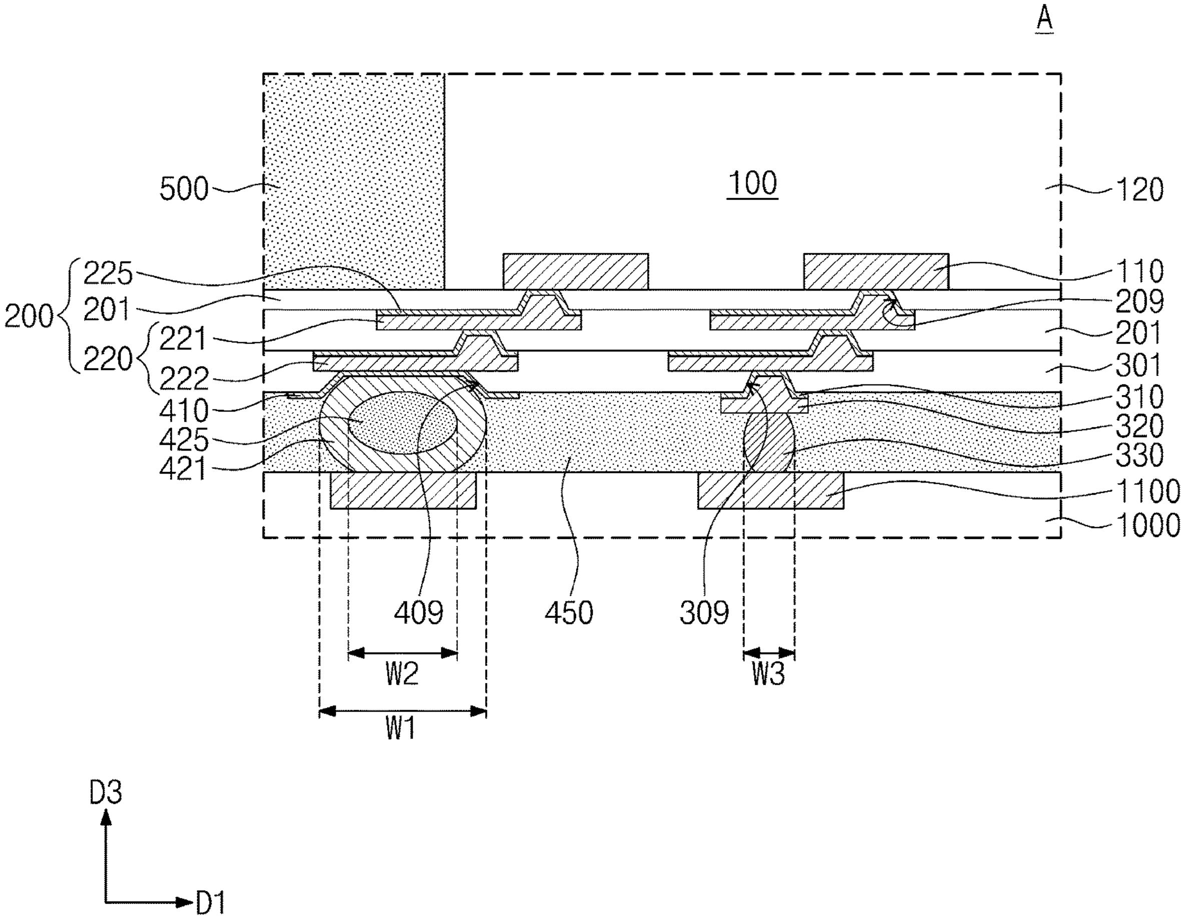
FIG. 2 is an enlarged view of a region 'A' of FIG. 1.

FIG. 2 is an enlarged view of a region 'A' of FIG. 1.

Referring to FIGS. 1 and 2, a semiconductor package 10A may include a package substrate 1000, a semiconductor chip 100, a first redistribution substrate 200, under bump pads 320, solder balls 330, ball pads 410, core balls 420, and a molding layer 500.

The package substrate 1000 may include substrate pads 1100 and external pads 1200. Lower connection terminals 1300 may be on bottom surfaces of the external pads 1200. The lower connection terminals 1300 may include solder balls or solder bumps.

In some embodiments, the package substrate 1000 may be a redistribution substrate. The package substrate 1000 may include the substrate pads 1100 at its top surface. The package substrate 1000 may include the external pads 1200 at its bottom surface. The substrate pads 1100 and the external pads 1200 may include a conductive material. The lower connection terminals 1300 may be on the external pads 1200, respectively, and may be electrically connected to external terminals. The substrate pads 1100 and the external pads 1200 may be electrically connected to each other through internal interconnection lines in the package substrate 1000.

In certain embodiments, the package substrate 1000 may be a printed circuit board (PCB). The package substrate 1000 may have a core layer, and a peripheral part for interconnection on and under the core layer. For example, the package substrate 1000 may be an interposer.

The semiconductor chip 100 may be on the package substrate 1000. The semiconductor chip 100 may be mounted on the package substrate 1000 by a flip-chip method. The semiconductor chip 100 may have a first surface 100S1 and a second surface 100S2, which are opposite to each other. The semiconductor chip 100 may include chip pads 110 and a circuit layer 120. The circuit layer 120 may be adjacent to the first surface 100S1. The circuit layer 120 may include integrated circuits. The chip pads 110 may be on the first surface 100S1 of the semiconductor chip 100. The chip pads 110 may include a conductive material. The semiconductor chip 100 may be a logic chip or a memory chip. For example, the semiconductor chip 100 may be the logic chip. The logic chip may include an ASIC chip or an application processor (AP) chip. The ASIC chip may include an application specific integrated circuit (ASIC). Alternatively, the semiconductor chip 100 may include a central processing unit (CPU) or a graphic processing unit (GPU). The memory chip may include a high bandwidth memory (HBM) chip.

The first redistribution substrate 200 may be on the first surface 100S1 of the semiconductor chip 100. The first redistribution substrate 200 may include a first insulating layer 201, first redistribution patterns 220, and first seed patterns 225. The first insulating layer 201 may be on the first surface 100S1 of the semiconductor chip 100 to cover the semiconductor chip 100 and the chip pads 110. First openings 209 may be formed in the first insulating layer 201 to expose the chip pads 110. For example, the first insulating layer 201 may include an organic material such as a photosensitive insulating material (e.g., a photo-imagable dielectric (PID) material). For example, the photosensitive insulating material may include at least one of photosensitive polyimide, polybenzoxazole, a phenol-based polymer, or a benzocyclobutene-based polymer. The first insulating layer 201 may be a plurality of first insulating layers 201 and may be stacked. The number of the stacked first insulating layers 201 may be varied. For example, the plurality of first insulating layers 201 may include the same material. In this case, an interface between the first insulating layers 201 adjacent to each other may not be observed or visible. A bottom surface of the first redistribution substrate 200 may include a bottom surface of a lowermost first insulating layer 201.

The first redistribution patterns 220 may be in the first openings 209. The first redistribution patterns 220 may be laterally spaced apart from each other and may be electrically separated from each other. It may be understood that when two components are referred to as being laterally spaced apart from each other, they may be horizontally spaced apart from each other. The term 'horizontal' may mean a direction parallel to a top surface of the semiconductor chip 100 or a first direction D1. The first redistribution patterns 220 may include a metal (e.g., copper). It may be understood that when a component is referred to as being electrically connected to the first redistribution substrate 200, it may be electrically connected to at least one of the first redistribution patterns 220.

Each of the first redistribution patterns 220 may include a first via and a first interconnection line. The first via of each of the first redistribution patterns 220 may be in a corresponding first insulating layer 201. The first interconnection line may be on a bottom surface of the first via and may be connected to the first via without an interface therebetween. A width of the first interconnection line may be greater than a width of the bottom surface of the first via. The first interconnection line may extend onto a bottom surface of a corresponding first insulating layer 201. In the present specification, the term 'via' may mean a component for vertical connection, and the term 'interconnection line' may mean a component for horizontal connection. The term 'vertical' may mean 'being parallel to a third direction D3'. In the present specification, a term 'level' may mean a vertical level, and a level difference may be measured in the third direction D3.

The first redistribution patterns 220 may include first sub-redistribution patterns 221 and second sub-redistribution patterns 222. The first via of each of the first sub-redistribution patterns 221 may be on a bottom surface of a corresponding chip pad 110 of the semiconductor chip 100. The second sub-redistribution patterns 222 may be on bottom surfaces of the first sub-redistribution patterns 221 and may be connected to the first sub-redistribution patterns 221.

The number of the stacked first redistribution patterns 220 is not limited to FIG. 2 but may be variously changed. For some examples, the first sub-redistribution patterns 221 may be omitted, and the second sub-redistribution patterns 222 may be on the bottom surfaces of the chip pads 110. For certain examples, third sub-redistribution patterns (not shown) may further be between the first sub-redistribution patterns 221 and the second sub-redistribution patterns 222.

The first seed patterns 225 may be on top surfaces of the first redistribution patterns 220, respectively. For example, each of the first seed patterns 225 may be on or cover a top surface and a side surface of the first via and a top surface of the first interconnection line of a corresponding first redistribution pattern 220. Each of the first seed patterns 225 may not extend onto a side surface of the first interconnection line of the corresponding first redistribution pattern 220. The first seed patterns 225 in an uppermost first insulating layer 201 may be between the chip pads 110 and the first sub-redistribution patterns 221. The first seed patterns 225 in the uppermost first insulating layer 201 may be in direct contact with the chip pads 110. The first seed patterns 225 may include a different material from that of the first redistribution patterns 220. For example, the first seed patterns 225 may include a conductive seed material. The conductive seed material may include copper, titanium, and/or an alloy thereof. The first seed patterns 225 may function as barrier layers to prevent diffusion of a material included in the first redistribution patterns 220.

The molding layer 500 may be on the top surface of the first redistribution substrate 200 and may cover the semiconductor chip 100. For example, the molding layer 500 may be on or cover the top surface and a side surface of the semiconductor chip 100. Unlike FIG. 1, the molding layer 500 may be on or cover the side surface of the semiconductor chip 100 but may expose the top surface of the semiconductor chip 100. A side surface of the molding layer 500 may be vertically aligned with a side surface of the first redistribution substrate 200. The molding layer 500 may not extend between the first redistribution substrate 200 and the semiconductor chip 100. The molding layer 500 may include an insulating polymer such as an epoxy molding compound.

A protective layer 301 may be on bottom surfaces of the second sub-redistribution patterns 222 to cover the second sub-redistribution patterns 222 and the lowermost first insulating layer 201. The protective layer 301 may include the same material as the first insulating layer 201. When the protective layer 301 and the lowermost first insulating layer 201 include the same material, an interface between the protective layer 301 and the lowermost first insulating layer 201 may not be observed or visible. Second openings 309 and third openings 409 may be formed in the protective layer 301 to expose the second sub-redistribution patterns 222. The second openings 309 and the third openings 409 may be spaced apart from each other.

The under bump pads 320 may be on the bottom surfaces of some of the second sub-redistribution patterns 222, respectively. The under bump pads 320 may be in the second openings 309. Thus, the under bump pads 320 may be electrically connected to the first redistribution substrate 200.

Under bump seed patterns 310 may be between the protective layer 301 and the under bump pads 320 and between the under bump pads 320 and the second sub-redistribution patterns 222. Thicknesses of the under bump seed patterns 310 may be less than thicknesses of the under bump pads 320. The under bump seed patterns 310 may include a conductive seed material. The under bump seed patterns 310 may include a different material from that of the under bump pads 320. For example, the under bump seed patterns 310 may include titanium or a titanium-copper alloy. In certain embodiments, the under bump seed patterns 310 may include the same material as the under bump pads 320. In this case, an interface between the under bump seed pattern 310 and the under bump pad 320 may not be observed or visible.

The ball pads 410 may be on the bottom surfaces of others of the second sub-redistribution patterns 222, respectively. The ball pads 410 may be in the third openings 409. Thus, the ball pads 410 may be electrically connected to the first redistribution substrate 200. The ball pads 410 may include a conductive material. For example, the ball pads 410 may include copper.

The solder balls 330 may be between the first redistribution substrate 200 and the package substrate 1000. For example, the solder balls 330 may be on corresponding under bump pads 320 so as to be connected to the under bump pads 320. The solder balls 330 may be on corresponding substrate pads 1100 of the package substrate 1000 so as to be connected to the corresponding substrate pads 1100. The solder balls 330 may include a solder material. For example, the solder material may include tin, bismuth, lead, silver, or an alloy thereof. For example, each of the solder balls 330 may have a diameter W3 in the first direction D1, and for example, the diameter W3 of each of the solder balls 330 may range from 10 m to 50 m.

The core balls 420 may be between the first redistribution substrate 200 and the package substrate 1000. For example, the core balls 420 may be on corresponding ball pads 410 so as to be connected to the ball pads 410. The core balls 420 may be on corresponding substrate pads 1100 of the package substrate 1000 so as to be connected to the corresponding substrate pads 1100. The solder balls 330 may be between at least two of the core balls 420. Each of the core balls 420 may have a diameter W1 in the first direction D1, and for example, the diameter W1 of each of the core balls 420 may range from 100 m to 500 m. The diameter W1 of each of the core balls 420 may be greater than the diameter W3 of each of the solder balls 330. For example, the diameter W1 of each of the core balls 420 may range from 5 times to 50 times the diameter W3 of each of the solder balls 330.

Each of the core balls 420 may be a composite-structural solder ball including a core 425 and a peripheral portion 421 surrounding the core 425. The core 425 may be located in a central portion of each of the core balls 420. The peripheral portion 421 may be on or cover the core 425. A diameter W2 of the core 425 in the first direction D1 may range from 60 m to 560 m. The core 425 may be formed of a metal (e.g., copper (Cu)) or a polymer. The peripheral portion 421 may include a solder material. In certain embodiments, each of the core balls 420 may have a bump or pillar shape connected to the corresponding substrate pad 1100 of the package substrate 1000. In certain embodiments, the solder balls 330 may be referred to as first solder balls, and the core balls 420 may be referred to as second solder balls.

An underfill layer 450 may be between the first redistribution substrate 200 and the package substrate 1000. The underfill layer 450 may be between a bottom surface of the first redistribution substrate 200 and the top surface of the package substrate 1000 to fill a space between the solder balls 330 and the core balls 420. The underfill layer 450 may be on the top surface of the package substrate 1000. The underfill layer 450 may include an insulating polymer material such as an epoxy resin.

The semiconductor chip 100 may be electrically connected to the package substrate 1000 through the first redistribution substrate 200, the under bump pads 320 and the solder balls 330. The semiconductor chip 100 may be electrically connected to the package substrate 1000 through the first redistribution substrate 200, the ball pads 410 and the core balls 420.

Figure 3:
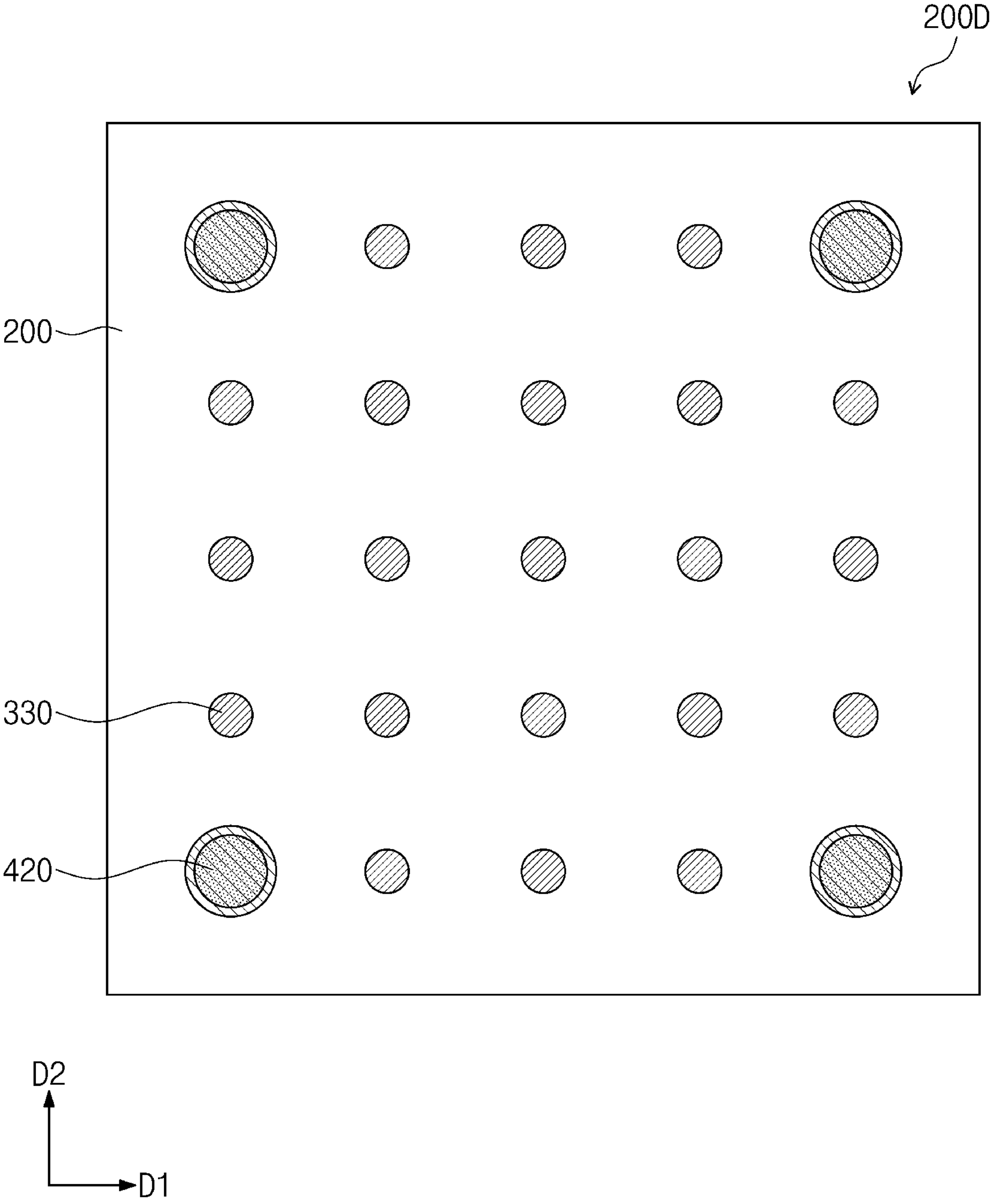
FIG. 3 is a plan view illustrating a configuration of the core balls of the semiconductor package of FIG. 1.

FIG. 3 is a plan view illustrating a configuration of the core balls of FIG. 1. FIG. 3 schematically illustrates a bottom surface 200D of the first redistribution substrate 200. In other words, FIG. 3 is a bottom view of the first redistribution substrate 200.

Referring to FIGS. 1 to 3, the core balls 420 may be at corners of the first redistribution substrate 200 (see, e.g., FIG. 3). The core balls 420 and the solder balls 330 may be spaced apart from each other. For example, the core balls 420 and the solder balls 330 may be arranged and spaced apart from each other in the first direction D1 and a second direction D2. The solder balls 330 may be between the core balls 420. The numbers of the solder balls 330 and the core balls 420 are not limited to the numbers illustrated in FIG. 3.

Figure 4:
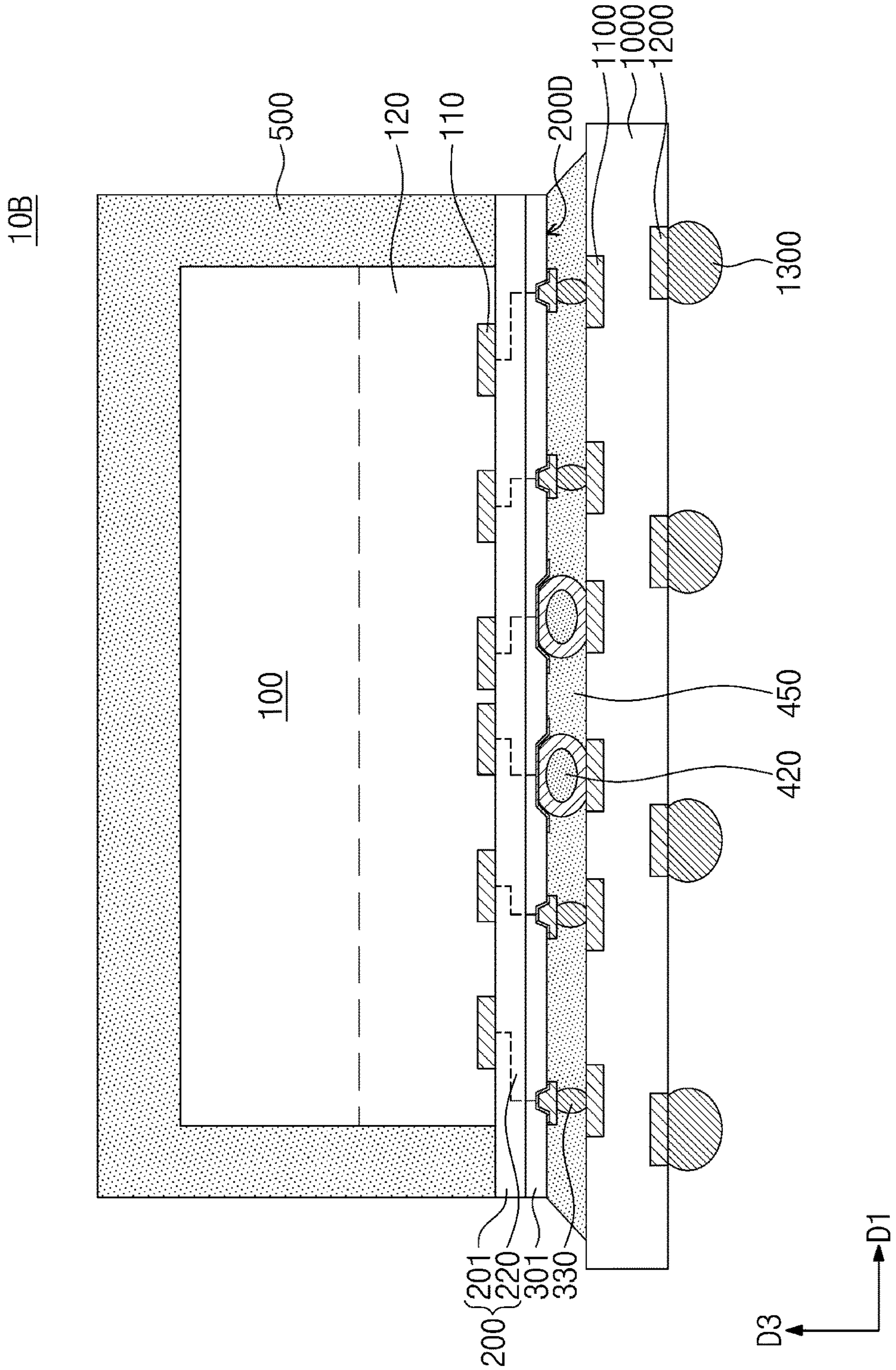
FIG. 4 is a cross-sectional view illustrating a semiconductor package according to some embodiments of the inventive concepts.

FIG. 4 is a cross-sectional view illustrating a semiconductor package according to some embodiments of the inventive concepts.

Figure 5:
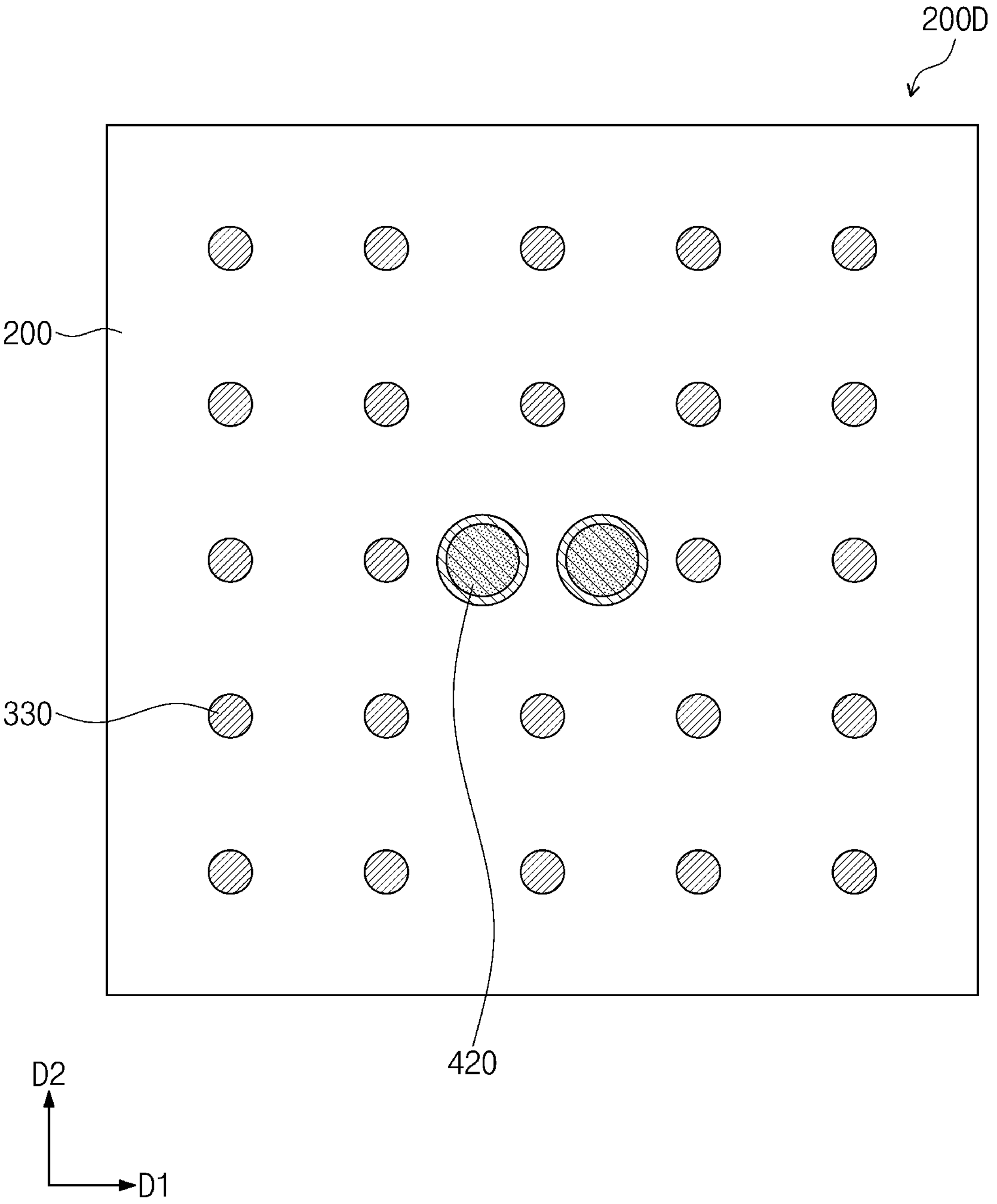
FIG. 5 is a plan view illustrating a configuration of the core balls of the semiconductor package of FIG. 4.

FIG. 5 is a plan view illustrating a configuration of the core balls of FIG. 4. FIG. 5 schematically illustrates the bottom surface 200D of the first redistribution substrate 200. In other words, FIG. 5 is a bottom view of the first redistribution substrate 200. Hereinafter, differences between the present embodiments and the above embodiments of FIGS. 1 to 3 will be mainly described for the purpose of ease and convenience in explanation.

Referring to FIGS. 4 and 5, a semiconductor package 10B may include the package substrate 1000, the semiconductor chip 100, the first redistribution substrate 200, the under bump pads 320, the solder balls 330, the ball pads 410, the core balls 420, and the molding layer 500. The core balls 420 may be on a central portion of the first redistribution substrate 200 when viewed in a plan view. The core balls 420 may be between the solder balls 330. The numbers of the solder balls 330 and the core balls 420 are not limited to the numbers illustrated in FIG. 5.

Figure 6:
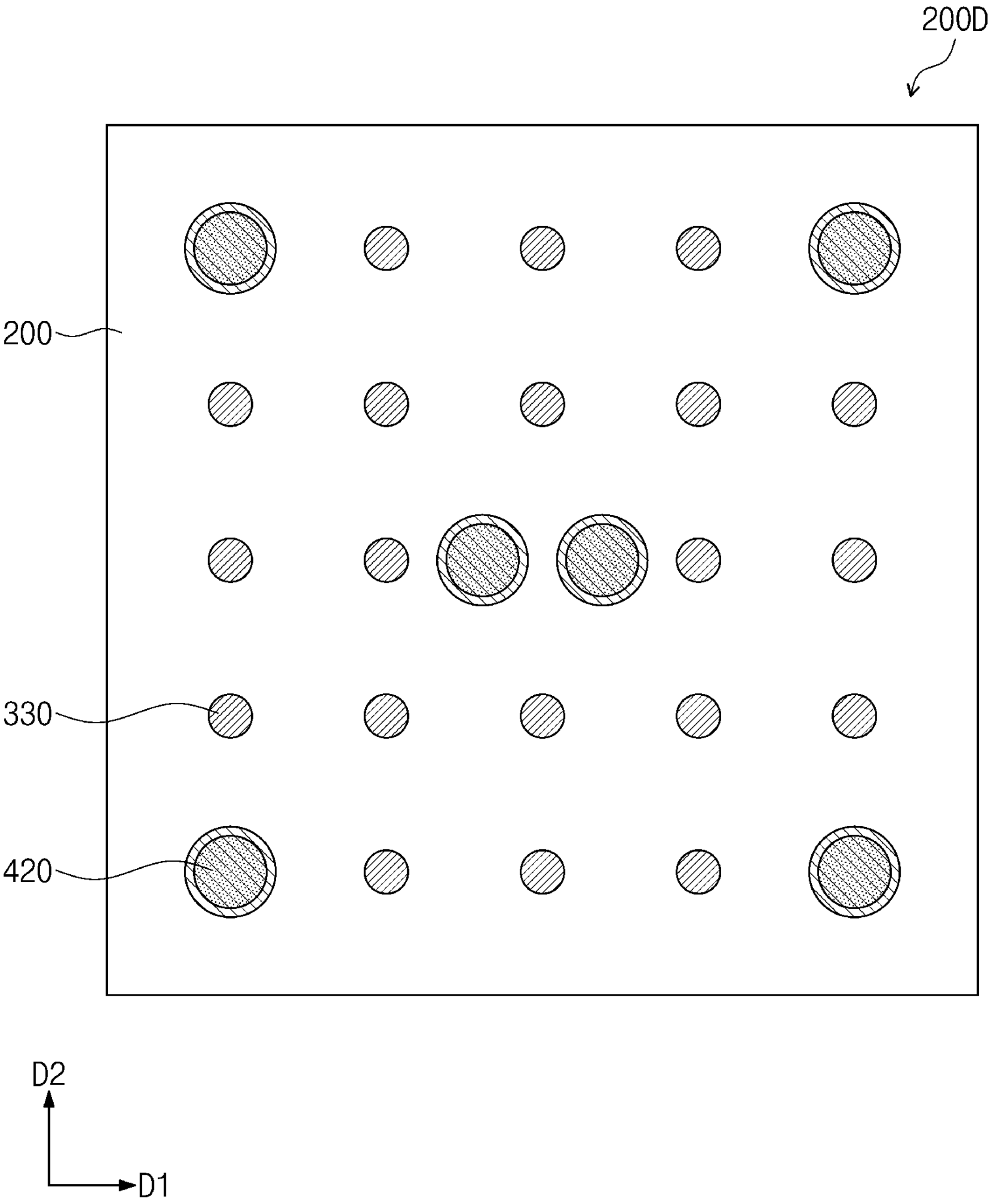
FIG. 6 is a plan view illustrating a semiconductor package according to some embodiments of the inventive concepts.

FIG. 6 is a plan view corresponding to FIGS. 3 and 5 to illustrate a semiconductor package according to some embodiments of the inventive concepts. Hereinafter, differences between the present embodiments and the above embodiments of FIGS. 1 to 5 will be mainly described for the purpose of ease and convenience in explanation.

Referring to FIG. 6, the core balls 420 may be on the corners and the central portion of the bottom surface of the first redistribution substrate 200. The core balls 420 and the solder balls 330 may be spaced apart from each other. The numbers of the solder balls 330 and the core balls 420 are not limited to the numbers illustrated in FIG. 6.

In a process of mounting the semiconductor chip 100 on the package substrate 1000 by a flip-chip bonding method, heat may be applied in a reflow temperature range of about 25 degrees Celsius to about 250 degrees Celsius. At this time, warpage may occur due to a difference in thermal expansion coefficient between the semiconductor chip 100 and the package substrate 1000. A short between the solder balls 330 may occur when the warpage occurs, but the core balls 420 having sizes greater than those of the solder balls 330 may be between the semiconductor chip 100 and the package substrate 1000 to support the semiconductor chip 100 and the package substrate 1000 in the embodiments of the inventive concepts. Thus, a likelihood of a short may be reduced, or the short by the warpage may be prevented.

In FIGS. 1 to 6, the positions of the core balls 420 may be portions vulnerable to a short by the warpage. Thus, to prevent reduce a likelihood of or the short, the core balls 420 may be on the corner and/or the central portion of the bottom surface of the first redistribution substrate 200. To reduce a likelihood of or prevent the short, the core ball(s) 420 may be on other portion(s) of the first redistribution substrate 200 at which the short by the warpage may occur, not limited to the corner and/or the central portion. As a result, structural stability and electrical characteristics of the semiconductor package may be improved. In addition, thicknesses of the semiconductor chip 100 and the package substrate 1000 may be reduced to provide a small semiconductor package.

Figure 7:
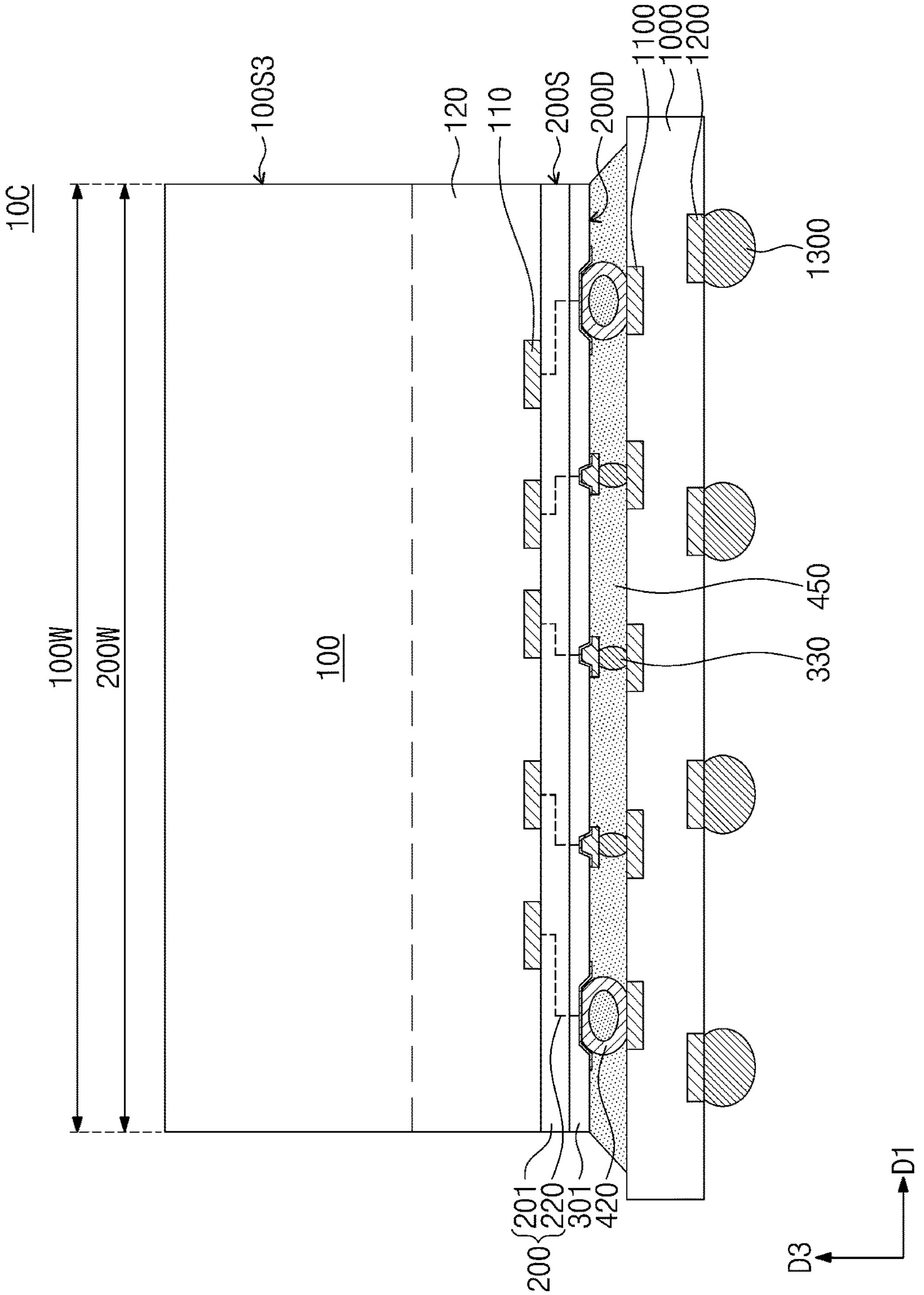
FIG. 7 is a cross-sectional view illustrating a semiconductor package according to some embodiments of the inventive concepts.

FIG. 7 is a cross-sectional view illustrating a semiconductor package according to some embodiments of the inventive concepts.

Referring to FIG. 7, a semiconductor package 10C may include a package substrate 1000, a semiconductor chip 100, a first redistribution substrate 200, under bump pads 320, solder balls 330, ball pads 410, and core balls 420. However, the semiconductor package 10C may not include the molding layer 500 of FIGS. 1 and 4. The semiconductor chip 100 may have a width 100W in the first direction D1. The first redistribution substrate 200 may have a width 200W in the first direction D1. The width 100W of the semiconductor chip 100 may be substantially equal to the width 200W of the first redistribution substrate 200. A side surface 100S3 of the semiconductor chip 100 may be vertically aligned with a side surface 200S of the first redistribution substrate 200.

The package substrate 1000, the semiconductor chip 100, the first redistribution substrate 200, the under bump pads 320, the solder balls 330, the ball pads 410 and the core balls 420 may be substantially the same as described with reference to FIGS. 1 to 3.

Figure 8:
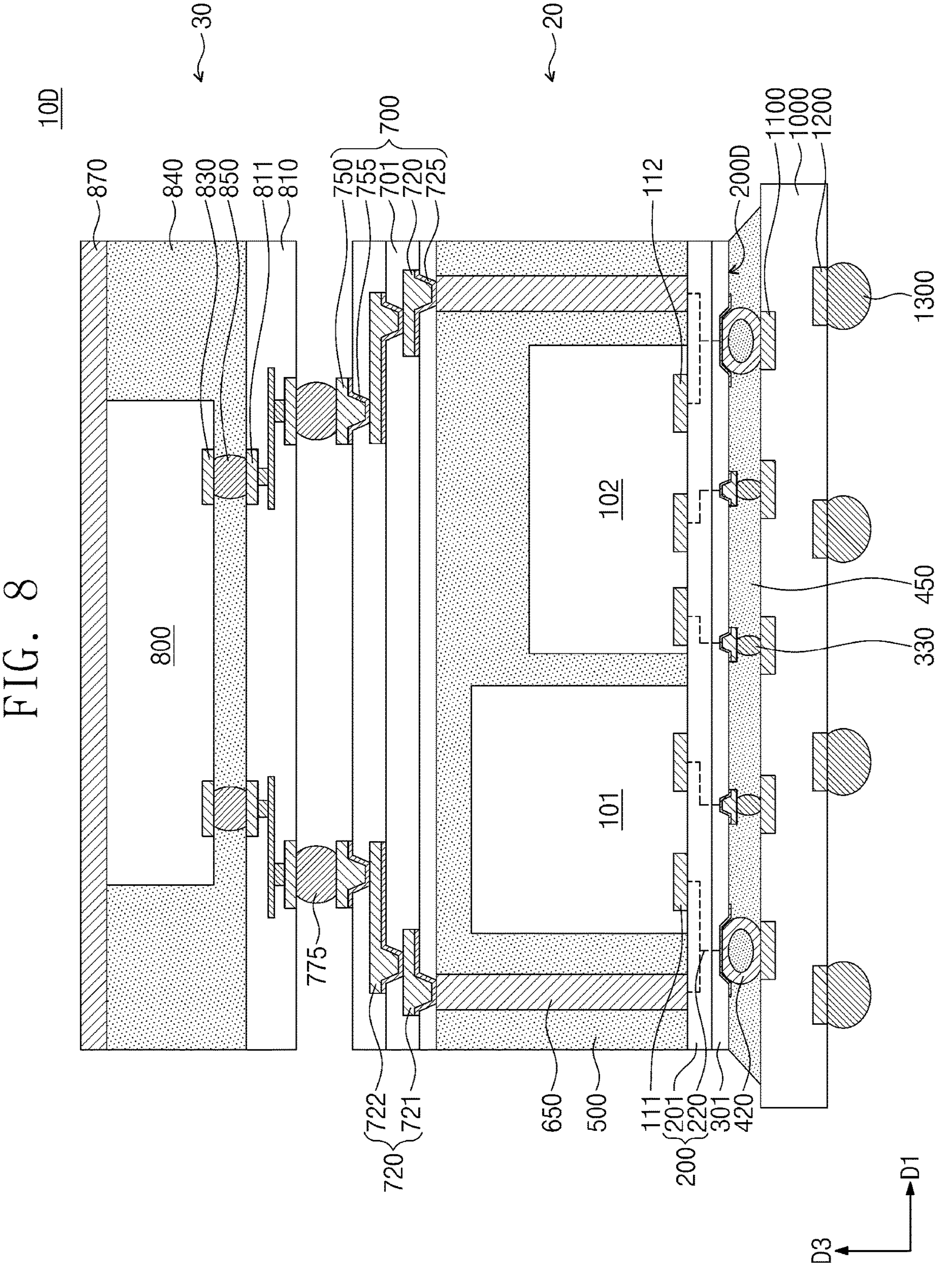
FIG. 8 is a cross-sectional view illustrating a semiconductor package according to some embodiments of the inventive concepts.

FIG. 8 is a cross-sectional view illustrating a semiconductor package according to some embodiments of the inventive concepts.

Referring to FIG. 8, a semiconductor package 10D may include a lower package 20, an upper package 30, and connection bumps 775. The lower package 20 may include a package substrate 1000, a first semiconductor chip 101, a second semiconductor chip 102, a first redistribution substrate 200, under bump pads 320, solder balls 330, ball pads 410, core balls 420, a molding layer 500, conductive structures 650, and a second redistribution substrate 700. The package substrate 1000, the first redistribution substrate 200, the under bump pads 320, the solder balls 330, the ball pads 410, the core balls 420 and the molding layer 500 may be substantially the same as described with reference to FIGS. 1 to 3.

The first semiconductor chip 101 and the second semiconductor chip 102 may be mounted on the top surface of the first redistribution substrate 200. Each of the first semiconductor chip 101 and the second semiconductor chip 102 may be the same or similar as the semiconductor chip 100 described with reference to FIG. 1. The second semiconductor chip 102 may be laterally spaced apart from the first semiconductor chip 101. The second semiconductor chip 102 may be a semiconductor chip of which a kind is different from that of the first semiconductor chip 101. For example, the first semiconductor chip 101 may include one of a logic chip, a memory chip, and a power management chip, and the second semiconductor chip 102 may include another of the logic chip, the memory chip, and the power management chip. The power management chip may include a power management integrated circuit (PMIC). For example, the first semiconductor chip 101 may be an ASIC chip, and the second semiconductor chip 102 may be the power management chip. Alternatively, the kind of the second semiconductor chip 102 may be the same as the kind of the first semiconductor chip 101. Unlike FIG. 8, at least one of the first semiconductor chip 101 or the second semiconductor chip 102 may be omitted. In certain embodiments, a third semiconductor chip (not shown) may be additionally mounted on the top surface of the first redistribution substrate 200.

The conductive structures 650 may be on the top surface of the first redistribution substrate 200. For example, the conductive structures 650 may be on the top surface of an edge region of the first redistribution substrate 200. The conductive structures 650 may be laterally spaced apart from the first semiconductor chip 101 and the second semiconductor chip 102. The conductive structures 650 may be spaced apart from each other. A metal pillar may be on the first redistribution substrate 200 to form the conductive structure 650. In other words, the conductive structure 650 may be the metal pillar. The conductive structure 650 may include a metal (e.g., copper).

The first seed patterns 225 in the uppermost first insulating layer 201 may be in direct contact with first chip pads 111 of the first semiconductor chip 101, second chip pads 112 of the second semiconductor chip 102, and the conductive structures 650. The first semiconductor chip 101 and the second semiconductor chip 102 may be electrically connected to each other through the first redistribution substrate 200. Each of the conductive structures 650 may be electrically connected to a corresponding one of the first semiconductor chip 101, the second semiconductor chip 102, the solder balls 330 and the core balls 420 through the first redistribution substrate 200.

The molding layer 500 may be on the top surface of the first redistribution substrate 200 to be on or cover the first semiconductor chip 101 and the second semiconductor chip 102. The molding layer 500 may also cover side surfaces of the conductive structures 650. The molding layer 500 may not cover or be on top surfaces of the conductive structures 650. A side surface of the molding layer 500 may be aligned with a side surface of the first redistribution substrate 200.

The second redistribution substrate 700 may be on a top surface of the molding layer 500 and the top surfaces of the conductive structures 650. The second redistribution substrate 700 may include second insulating layers 701, second redistribution patterns 720, and redistribution pads 750. The second insulating layers 701 may be stacked on the molding layer 500. The second insulating layers 701 may be organic insulating layers. Each of the second insulating layers 701 may include an adhesive insulating film such as an Ajinomoto build-up film (ABF). For certain examples, the second insulating layers 701 may include a photosensitive insulating material. For example, the second insulating layers 701 may include the same material. An interface between the second insulating layers 701 adjacent to each other may not be observed or visible, but embodiments of the inventive concepts are not limited thereto. The number of the second insulating layers 701 may be variously changed.

The second redistribution patterns 720 may be laterally spaced apart from each other and may be electrically separated from each other. Each of the second redistribution patterns 720 may include a second via and a second interconnection line. The second via may be in a corresponding second insulating layer 701. The second interconnection line may be on the second via. A width of the second interconnection line of each of the second redistribution patterns 720 may be greater than a width of a top surface of the second via. The second interconnection line of each of the second redistribution patterns 720 may extend onto a top surface of a corresponding second insulating layer 701. The second redistribution patterns 720 may include a metal (e.g., copper).

Each of the second redistribution patterns 720 may include a lower redistribution pattern 721 and an upper redistribution pattern 722, which are stacked. The second via of the lower redistribution pattern 721 may be on a corresponding conductive structure 650 so as to be connected to the corresponding conductive structure 650. The upper redistribution pattern 722 may be on the lower redistribution pattern 721 and may be connected to the lower redistribution pattern 721. In the present specification, it may be understood that when a component is referred to as being electrically connected to the second redistribution substrate 700, it may be electrically connected to at least one of the second redistribution patterns 720.

The second redistribution substrate 700 may further include second seed patterns 725. The second seed patterns 725 may be on bottom surfaces of the second redistribution patterns 720, respectively. For example, each of the second seed patterns 725 may be on a bottom surface and a side surface of the second via of a corresponding second redistribution pattern 720 and may extend onto a bottom surface of the second interconnection line of the corresponding second redistribution pattern 720. The second seed patterns 725 may include the same material as or a different material from the conductive structures 650 and the second redistribution patterns 720. For example, the second seed patterns 725 may include a conductive seed material. The second seed patterns 725 may also function as barrier layers to prevent diffusion of the material included in the second redistribution patterns 720.

The redistribution pads 750 may be on a plurality of the upper redistribution patterns 722 so as to be connected to the upper redistribution patterns 722, respectively. The redistribution pads 750 may be laterally spaced apart from each other. The redistribution pads 750 may be connected to the conductive structures 650 through the second redistribution patterns 720, and therefore, at least one of the redistribution pads 750 may not be vertically aligned with the conductive structure 650 electrically connected thereto. Thus, the configuration of the redistribution pads 750 may be more freely designed.

A lower portion of each of the redistribution pads 750 may be in an uppermost second insulating layer 701. An upper portion of each of the redistribution pads 750 may extend onto a top surface of the uppermost second insulating layer 701. The upper portion of each of the redistribution pads 750 may have a width greater than that of the lower portion thereof. For example, the redistribution pads 750 may include a metal (e.g., copper).

The second redistribution substrate 700 may further include seed pads 755. The seed pads 755 may be between the upper redistribution patterns 722 and the redistribution pads 750, respectively. The seed pads 755 may further extend between the uppermost second insulating layer 701 and the redistribution pads 750. The seed pads 755 may include a conductive seed material.

The stacked number of the second redistribution patterns 720 may be variously changed. In some embodiments, the upper redistribution pattern 722 may be omitted, and each of the redistribution pads 750 may be on the lower redistribution pattern 721. In certain embodiments, an intermediate redistribution pattern (not shown) may also be between the lower redistribution pattern 721 and the upper redistribution pattern 722.

The upper package 30 may be on the lower package 20. For example, the upper package 30 may be on the second redistribution substrate 700. The upper package 30 may include an upper substrate 810, an upper semiconductor chip 800, and an upper molding layer 840. The upper substrate 810 may be a printed circuit board or a redistribution layer. Substrate pads 811 may be on a top surface of the upper substrate 810.

The upper semiconductor chip 800 may be on the upper substrate 810. The upper semiconductor chip 800 may include integrated circuits, and the integrated circuits may include a memory circuit, a logic circuit, or a combination thereof. The upper semiconductor chip 800 may be a semiconductor chip of which a kind is different from those of the first semiconductor chip 101 and the second semiconductor chip 102. For example, the upper semiconductor chip 800 may be a memory chip. Upper bumps 850 may be between the upper substrate 810 and the upper semiconductor chip 800 so as to be connected to the substrate pads 811 and upper chip pads 830 of the upper semiconductor chip 800. The upper bumps 850 may include a solder material. Unlike FIG. 8, the upper bumps 850 may be omitted, and the upper semiconductor chip 800 may be directly on the upper substrate 810. For example, the upper chip pads 830 may be connected directly to the substrate pads 811. In the present specification, it may be understood that when a component is referred to as being connected to the upper substrate 810, it may be connected to metal lines in the upper substrate 810.

The upper molding layer 840 may be on the upper substrate 810 to be on or cover the upper semiconductor chip 800. The upper molding layer 840 may extend into a gap region between the upper substrate 810 and the upper semiconductor chip 800 to seal or encapsulate the upper bumps 850. Alternatively, an underfill layer (not shown) may be in the gap region between the upper substrate 810 and the upper semiconductor chip 800. The upper molding layer 840 may include an insulating polymer such as an epoxy-based polymer.

The upper package 30 may further include an upper heat dissipation plate 870. The upper heat dissipation plate 870 may be on a top surface of the upper semiconductor chip 800 and a top surface of the upper molding layer 840. The upper heat dissipation plate 870 may include at least one of a heat sink, a heat slug, or a thermal interface material (TIM) layer. For example, the upper heat dissipation plate 870 may include a metal. Unlike FIG. 8, the upper heat dissipation plate 870 may further extend onto a side surface of the upper molding layer 840 and/or the side surface of the molding layer 500. In certain embodiments, the upper heat dissipation plate 870 may be omitted, and the upper molding layer 840 may further be on or cover the top surface of the upper semiconductor chip 800.

The connection bumps 775 may be between the second redistribution substrate 700 and the upper substrate 810 so as to be connected to the redistribution pads 750 and the upper substrate 810. Thus, the upper package 30 may be electrically connected to the second redistribution substrate 700 through the connection bumps 775. The connection bumps 775 may include a solder material. The connection bumps 775 may further include metal pillars. In the present specification, it may be understood that when a component is referred to as being electrically connected to the upper package 30, it may be electrically connected to the integrated circuits in the upper semiconductor chip 800.

In certain embodiments, the upper substrate 810 and the connection bumps 775 may be omitted, and the upper bumps 850 may be connected directly to the redistribution pads 750. In this case, the upper molding layer 840 may be in direct contact with the top surface of the second redistribution substrate 700. In certain embodiments, the upper substrate 810, the connection bumps 775 and the upper bumps 850 may be omitted, and the upper chip pads 830 of the upper semiconductor chip 800 may be connected directly to the redistribution pads 750.

Figure 9:
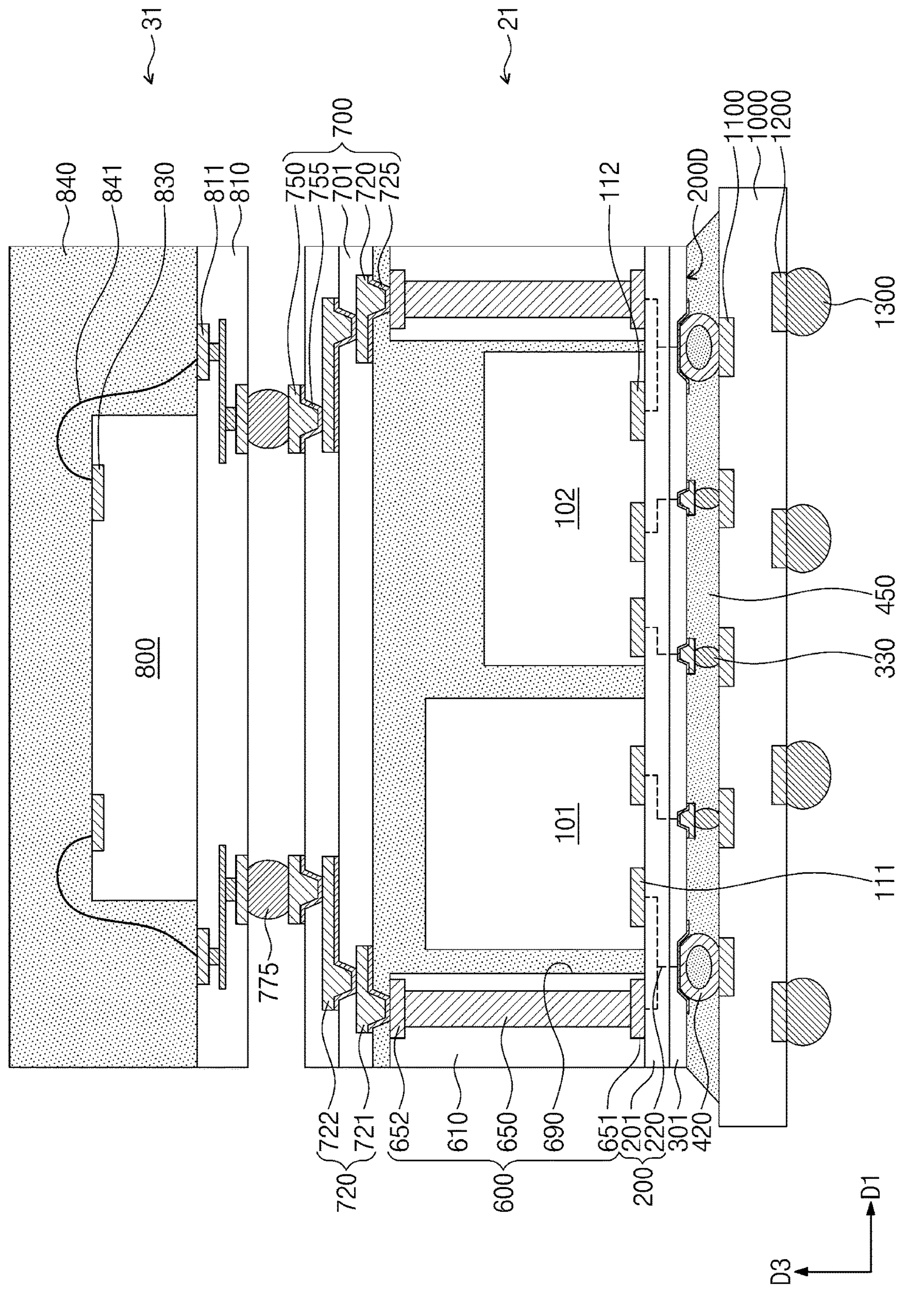
FIG. 9 is a cross-sectional view illustrating a semiconductor package according to some embodiments of the inventive concepts.

FIG. 9 is a cross-sectional view illustrating a semiconductor package according to some embodiments of the inventive concepts.

Referring to FIG. 9, a semiconductor package 10E may include a lower package 21, an upper package 31, and connection bumps 775. The lower package 21 may include a package substrate 1000, a first semiconductor chip 101, a second semiconductor chip 102, a first redistribution substrate 200, under bump pads 320, solder balls 330, ball pads 410, core balls 420, a molding layer 500, a connection substrate 600, and a second redistribution substrate 700.

The connection substrate 600 may be on the first redistribution substrate 200. The connection substrate 600 may have a substrate hole 690 penetrating the connection substrate 600. For example, the substrate hole 690 penetrating a top surface and a bottom surface of a printed circuit board may be formed to manufacture the connection substrate 600. The substrate hole 690 may be formed in a central portion of the connection substrate 600 when viewed in a plan view. The first semiconductor chip 101 and the second semiconductor chip 102 may be in the substrate hole 690 of the connection substrate 600. The first and second semiconductor chips 101 and 102 may be spaced apart from an inner side surface of the connection substrate 600.

The connection substrate 600 may include a base layer 610, first pads 651, conductive structures 650, and second pads 652. The base layer 610 may include an insulating material. For example, the base layer 610 may include a carbon-based material, ceramics, or a polymer. The substrate hole 690 may penetrate the base layer 610. The conductive structures 650 may be in the base layer 610. The first pads 651 may be on bottom surfaces of the conductive structures 650. The first pads 651 may be exposed at a bottom surface of the connection substrate 600. The second pads 652 may be on top surfaces of the conductive structures 650. The second pads 652 may be exposed at a top surface of the connection substrate 600. The second pads 652 may be electrically connected to the first pads 651 through the conductive structures 650. For example, the conductive structures 650, the first pads 651 and the second pads 652 may include a metal such as copper, aluminum, tungsten, titanium, tantalum, and/or an alloy thereof.

The molding layer 500 may be between the first and second semiconductor chips 101 and 102, between the first semiconductor chip 101 and the connection substrate 600 and between the second semiconductor chip 102 and the connection substrate 600. The molding layer 500 may be on or cover top surfaces of the first and second semiconductor chips 101 and 102 and a top surface of the connection substrate 600. In some embodiments, an adhesive insulating film may be adhered to the top surface of the connection substrate 600 and the top surfaces and side surfaces of the first and second semiconductor chips 101 and 102 to form the molding layer 500. For example, an Ajinomoto build-up film (ABF) may be used as the adhesive insulating film. Alternatively, the molding layer 500 may include an insulating polymer such as an epoxy-based polymer.

The second redistribution substrate 700 may be on the molding layer 500 and the connection substrate 600. The second redistribution substrate 700 may be substantially the same as described with reference to FIG. 8. However, lower redistribution patterns 721 may further extend into the molding layer 500 so as to be connected to the second pads 652.

The upper package 31 may be on the lower package 21. The upper package 31 may include an upper substrate 810, an upper semiconductor chip 800, and an upper molding layer 840. The upper package 31 may further include a heat dissipation plate. The upper package 31 and the connection bumps 775 may be substantially the same as described with reference to FIG. 8. However, upper chip pads 830 may be on a top surface of the upper semiconductor chip 800. The upper bumps 850 of FIG. 8 may be omitted. Bonding wires 851 may be on the upper chip pads 830 to electrically connect the upper chip pads 830 to the substrate pads 811.

Unlike FIG. 9, the upper package 31 may include the upper bumps 850 described with reference to FIG. 8 but may not include the bonding wires 851.

FIGS. 10 to 19 are views illustrating a method of manufacturing a semiconductor package according to some embodiments of the inventive concepts. Hereinafter, the descriptions to the same features as mentioned above will be omitted for the purpose of ease and convenience in explanation.

Figure 10:
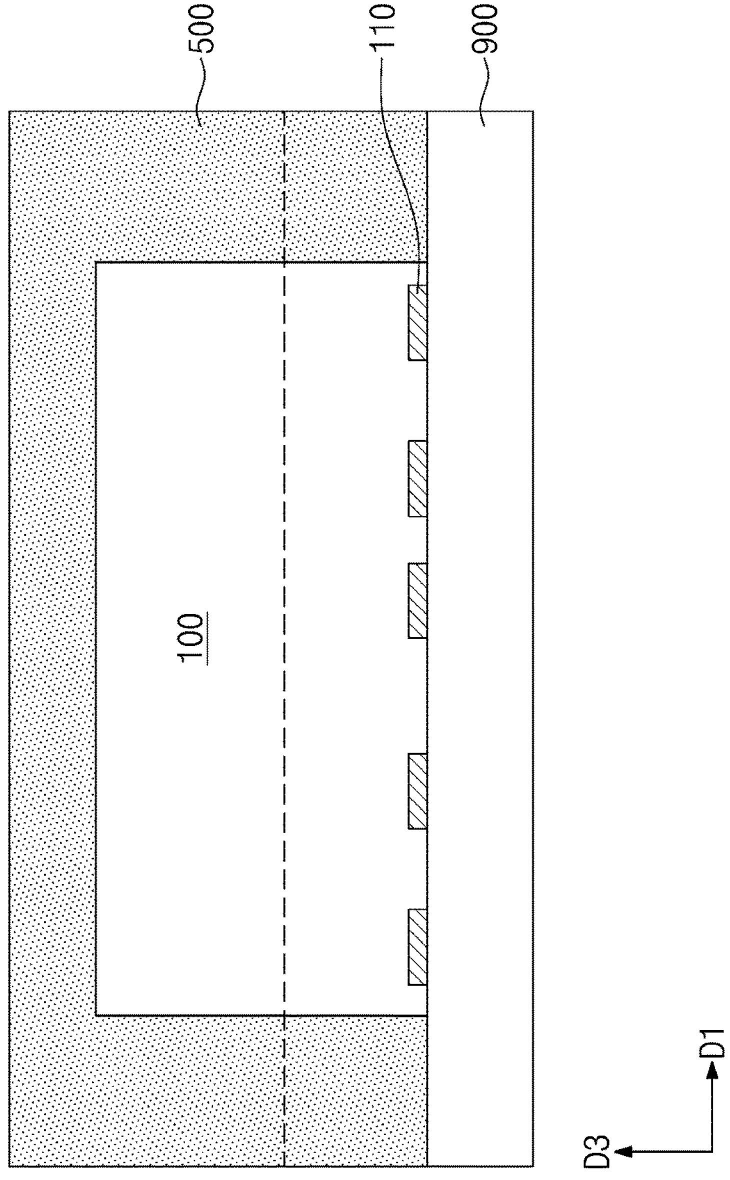
FIGS. 10 to 19 are views illustrating a method of manufacturing a semiconductor package according to some embodiments of the inventive concepts.

Referring to FIG. 10, a semiconductor chip 100 may be on a carrier substrate 900. At this time, chip pads 110 may face the carrier substrate 900. A molding layer 500 may be formed on the carrier substrate 900 to be on or cover the semiconductor chip 100. A bottom surface of the molding layer 500 may be at substantially the same level as a bottom surface of the semiconductor chip 100.

Figure 11:
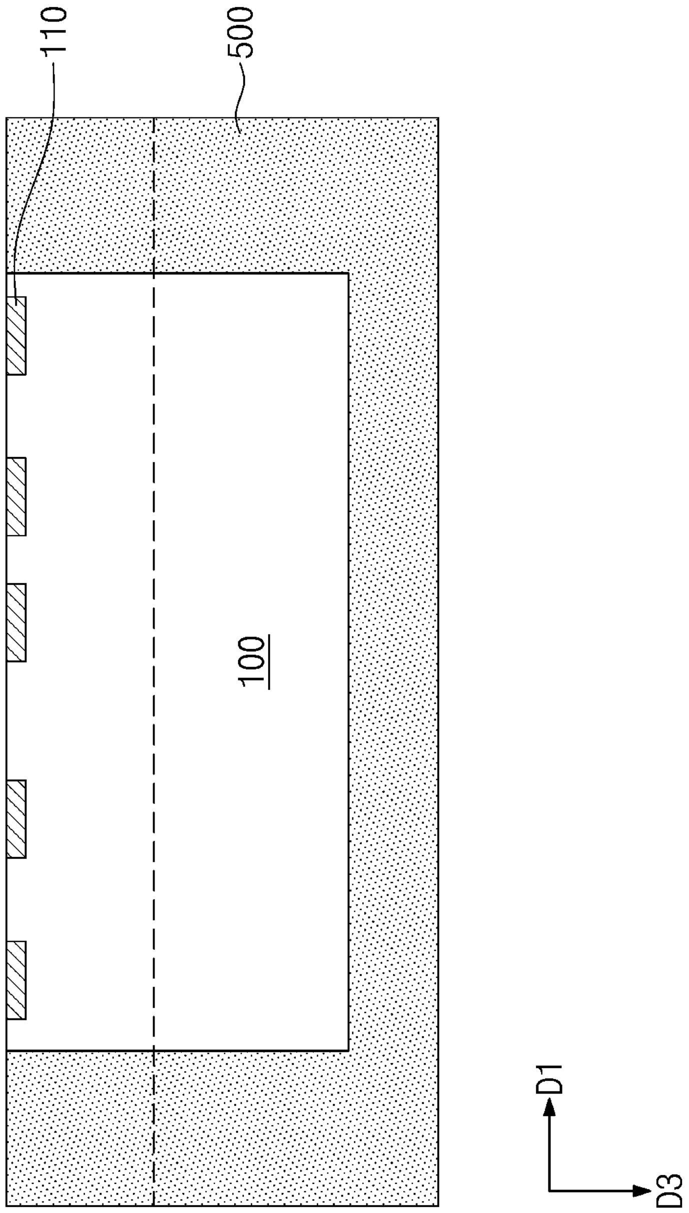

Referring to FIG. 11, the carrier substrate 900, the semiconductor chip 100 and the molding layer 500 may be turned over. The carrier substrate 900 may be removed to expose a top surface of the semiconductor chip 100 and a top surface of the molding layer 500. Thus, the chip pads 110 may be exposed.

Figure 12:
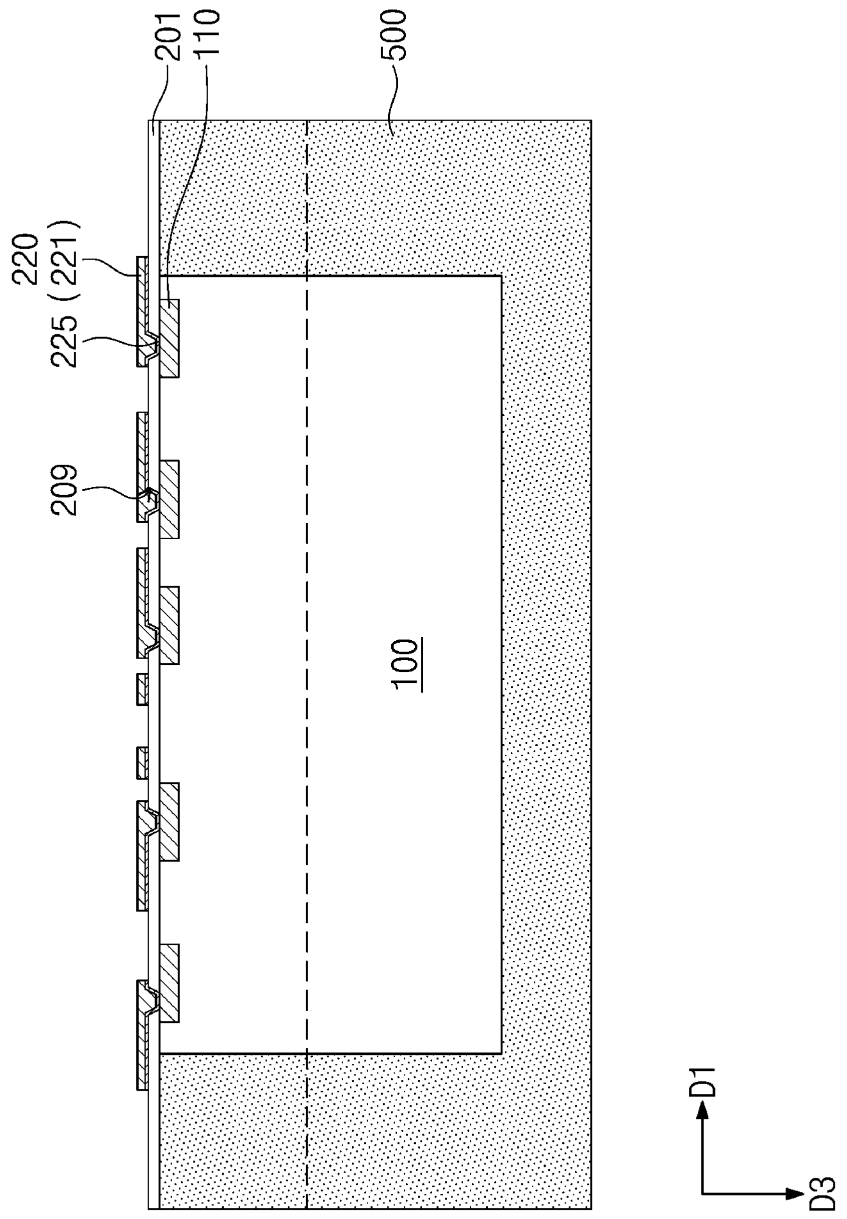

Referring to FIG. 12, a first insulating layer 201 may be formed on the semiconductor chip 100 and the molding layer 500 to be on or cover the top surface of the molding layer 500 and the top surface of the semiconductor chip 100. For example, the formation of the first insulating layer 201 may include performing a coating process using a photosensitive polymer. Openings 209 may be formed in the first insulating layer 201 to expose the chip pads 110. The formation of the openings 209 may be performed by a patterning process including an exposure process and a development process.

First redistribution patterns 220 and first seed patterns 225 may be formed in the openings 209 and on a top surface of the first insulating layer 201. An electroplating process using the first seed patterns 225 as electrodes may be performed to form the first redistribution patterns 220. The first redistribution patterns 220 may be first sub-redistribution patterns 221.

Figure 13:
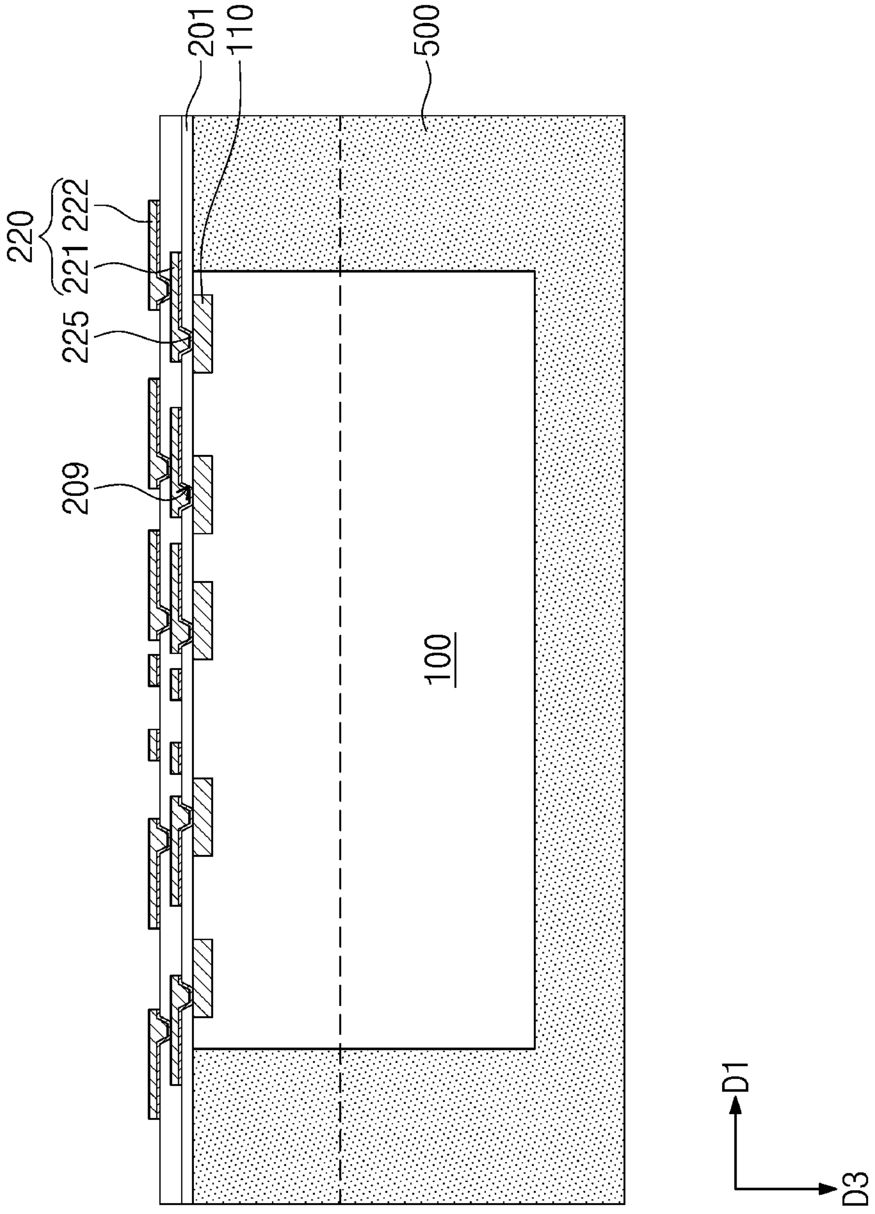

Referring to FIG. 13, the formation of the first insulating layer 201, the formation of the first seed patterns 225 and the formation of the first redistribution patterns 220 may be repeatedly performed to manufacture a first redistribution substrate 200. The manufacturing of the first redistribution substrate 200 may be performed by a chip-first process. The first redistribution substrate 200 may include the first insulating layers 201 stacked sequentially, the first seed patterns 225, and the first redistribution patterns 220. Each of the first redistribution patterns 220 may include the first sub-redistribution pattern 221 and a second sub-redistribution pattern 222. The second sub-redistribution patterns 222 may be formed on the first sub-redistribution patterns 221.

Figure 14:
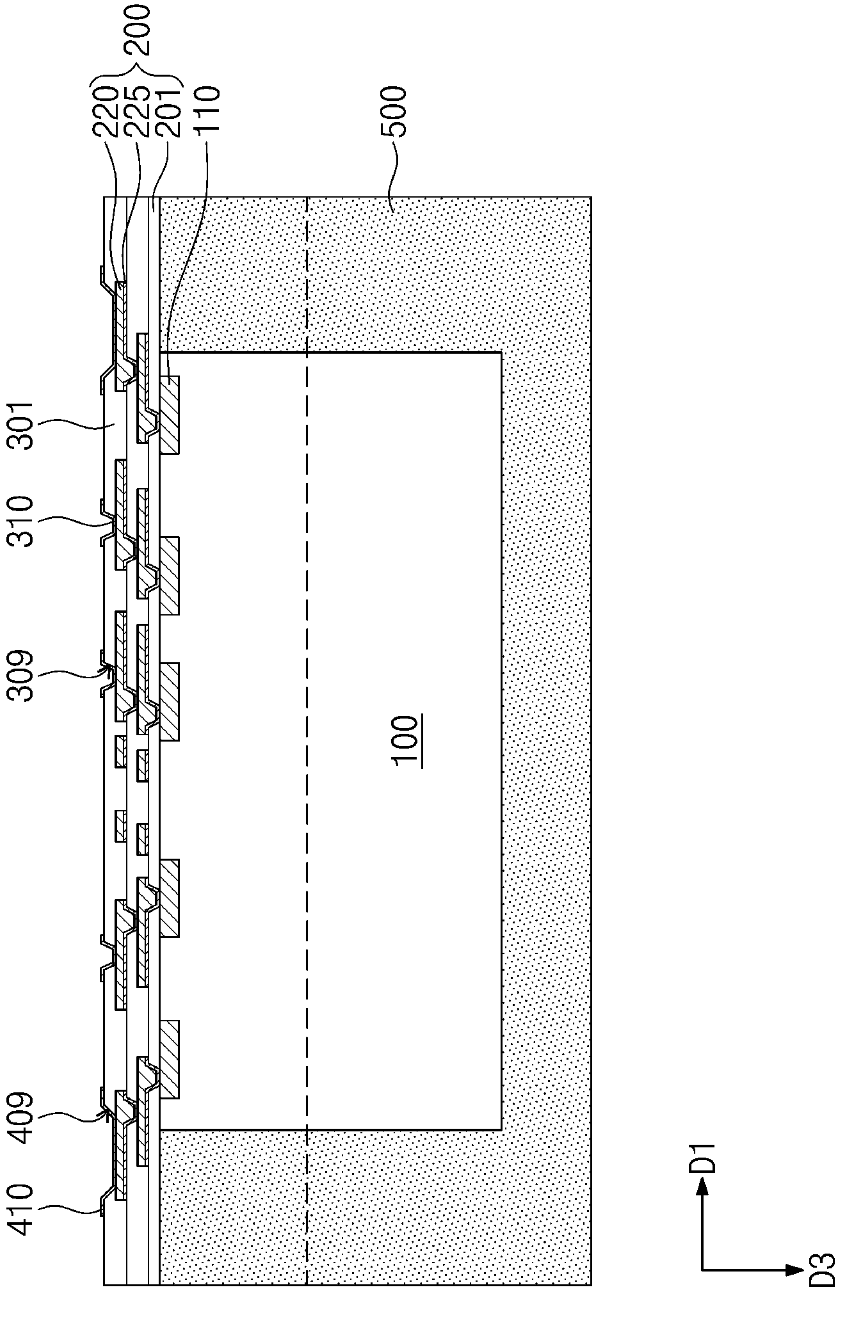

Referring to FIG. 14, a protective layer 301 may be formed on a top surface of the first redistribution substrate 200 to be on or cover the second sub-redistribution patterns 222. Second openings 309 and third openings 409 may be formed in the protective layer 301 to expose the second sub-redistribution patterns 222. In some embodiments, the formation of the second openings 309 and the third openings 409 may be performed by a laser drilling process. In certain embodiments, the formation of the protective layer 301, the second openings 309 and the third openings 409 may be performed by a photolithography process. For example, the second openings 309 and the third openings 409 may be formed by a patterning process including an exposure process and a development process.

Under bump seed patterns 310 may be formed in the second openings 309. Ball pads 410 may be formed in the third openings 409. For example, the formation of the under bump seed patterns 310 and the ball pads 410 may be performed using a deposition process or an electroless plating process. In addition, the formation of the under bump seed patterns 310 and the ball pads 410 may also be performed using a patterning process including an exposure process and a development process.

Figure 15:
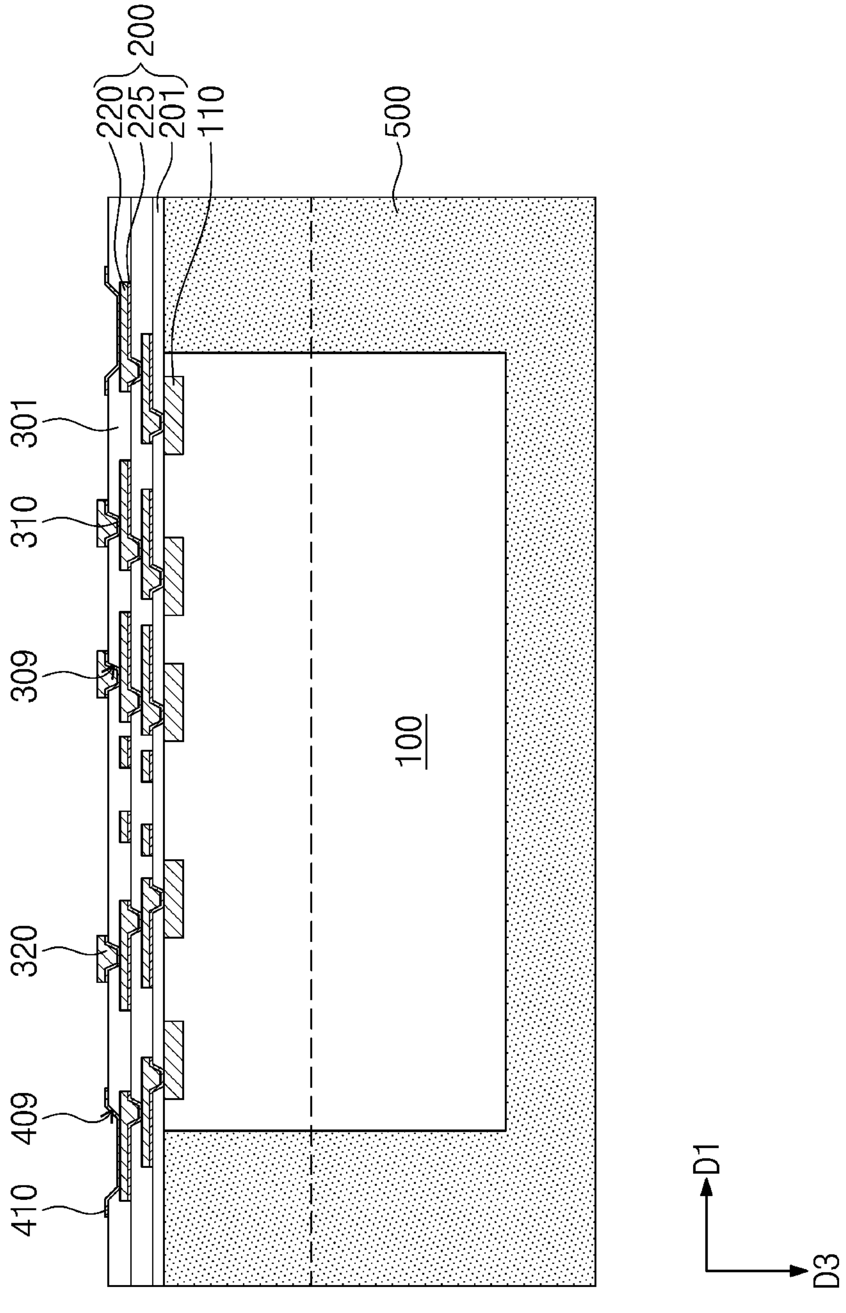

Referring to FIG. 15, under bump pads 320 may be formed on the under bump seed patterns 310. For example, the under bump pads 320 may be formed by an electroplating process.

Figure 16:
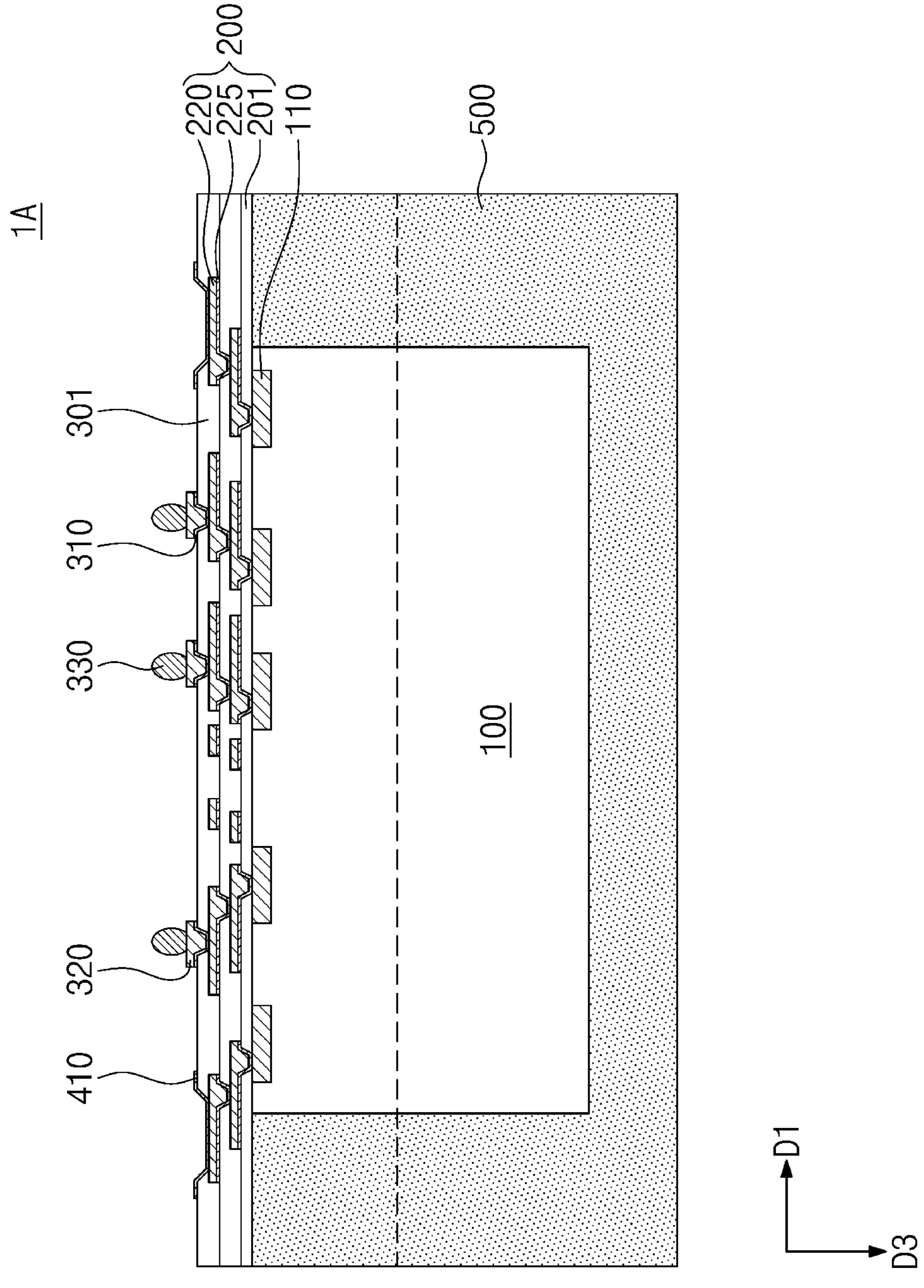

Referring to FIG. 16, solder balls 330 may be formed on the under bump pads 320. Thus, a first package structure 1A may be manufactured.

Figure 17:
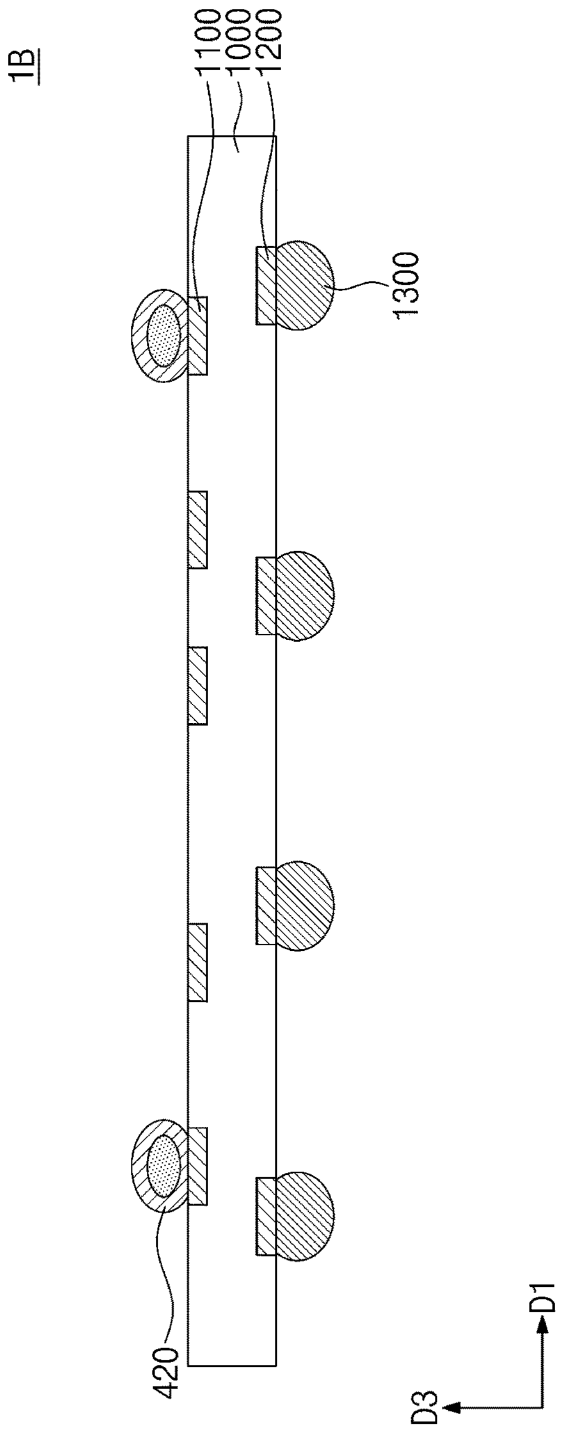

Referring to FIG. 17, core balls 420 may be formed on some of substrate pads 1100 of a package substrate 1000. Positions at which the core balls 420 are formed may be positions at which a short due to potential warpage may occur. Thus, a second package structure 1B may be manufactured.

Figure 18:
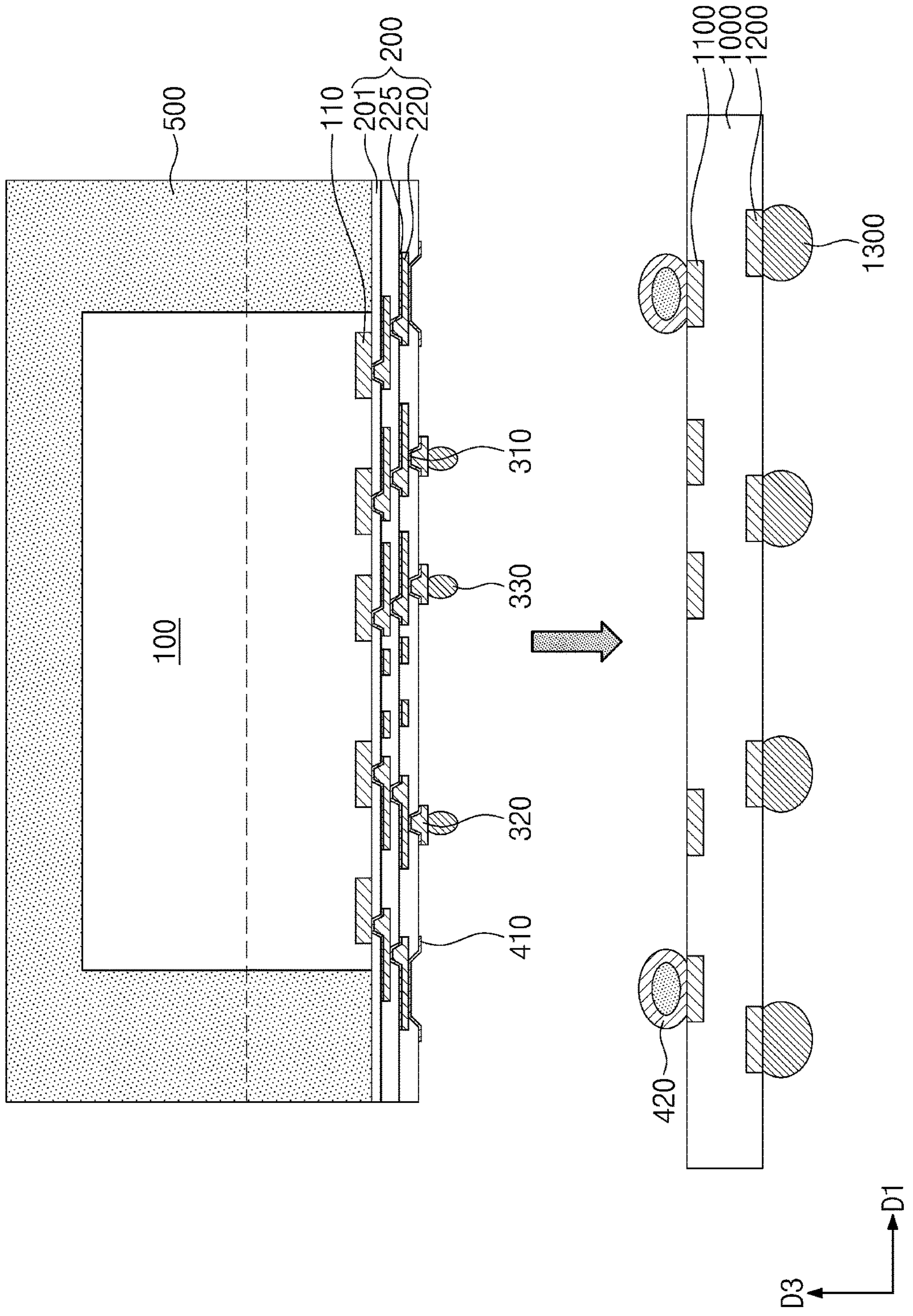
Figure 19:
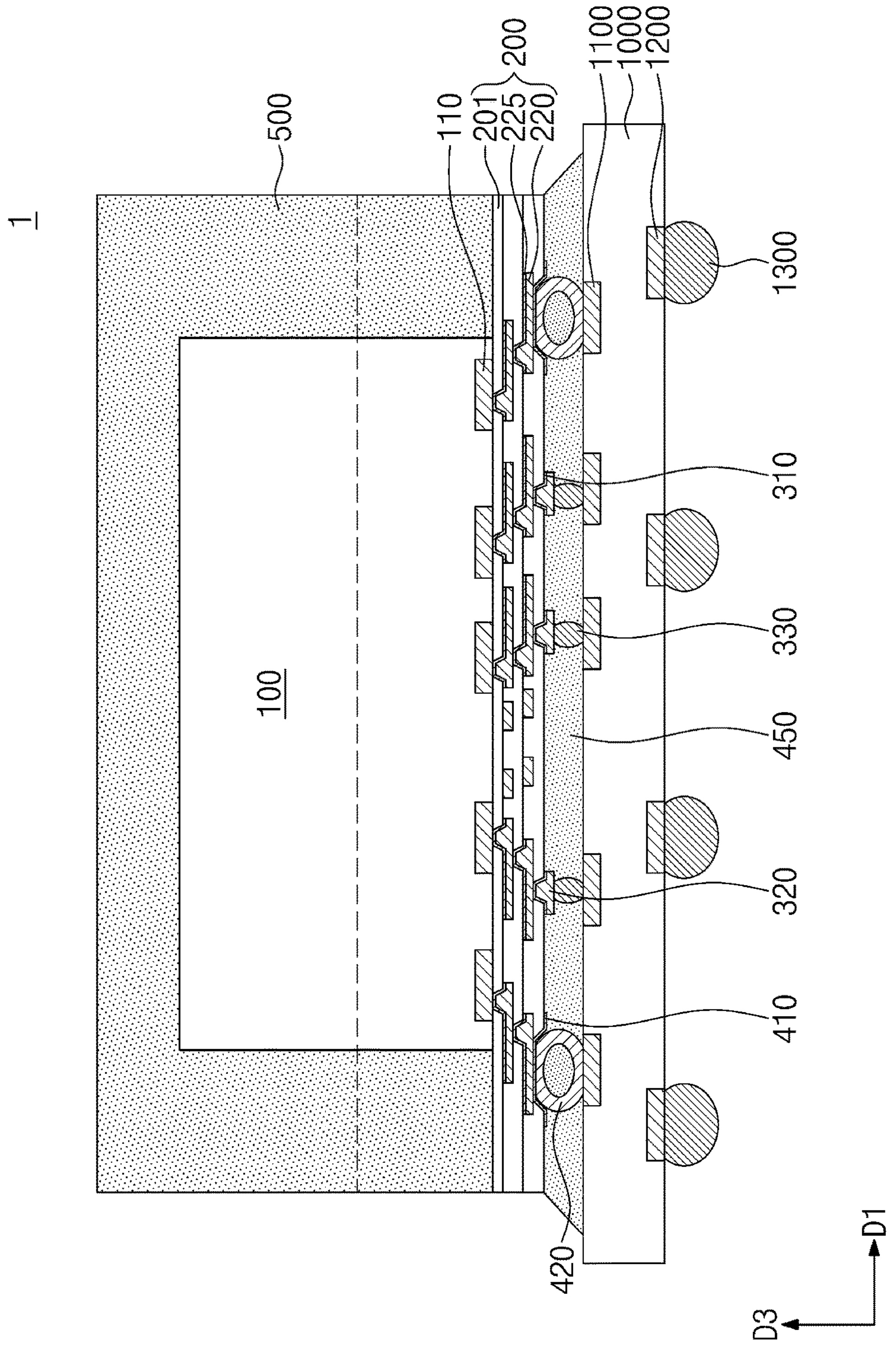

Referring to FIGS. 18 and 19, the first package structure 1A may be coupled onto the second package structure 1B. The semiconductor chip 100, the molding layer 500 and the first redistribution substrate 200 of the first package structure 1A may be turned over in such a way that the solder balls 330 face downward. This may be performed by a flip-chip process. At this time, an underfill layer 450 may further be formed. Thus, a semiconductor package 1 may be manufactured. The semiconductor package 1 may be the semiconductor package 10A described with referring to FIGS. 1 and 2.

According to the inventive concepts, the core ball may be utilized when the semiconductor chip is mounted using the flip-chip process. When heat is applied, the core ball may be between the semiconductor chip and the package substrate to support the semiconductor chip and package substrate, thereby improving stability of the semiconductor package.

In addition, thicknesses of the semiconductor chip and the substrate may be reduced to provide a small semiconductor package.

While the embodiments of the inventive concepts have been particularly shown and described, it will be understood by one of ordinary skill in the art that variations in form and detail may be made therein without departing from the spirit and scope of the attached claims.

What is claimed is:

1. A semiconductor package comprising:
   a package substrate;
   a plurality of substrate pads on a top surface of the package substrate;
   at least one core ball on at least one of the plurality of substrate pads;
   a redistribution substrate on the top surface of the package substrate; and
   a semiconductor chip mounted on the redistribution substrate, wherein the redistribution substrate is electrically connected to the package substrate by a plurality of solder balls on a bottom surface of the redistribution substrate, wherein the at least one core ball is electrically connected to the redistribution substrate, wherein a diameter of the at least one core ball is greater than a diameter of each of the solder balls, and wherein the at least one core ball is between at least two of the plurality of solder balls.

2. The semiconductor package of claim 1, wherein the at least one core ball includes a peripheral portion and a core, and wherein the peripheral portion is on the core.

3. The semiconductor package of claim 1, wherein the at least one core ball and the plurality of solder balls are spaced apart from each other.

4. The semiconductor package of claim 1, wherein the at least one core ball comprises a plurality of core balls, and wherein each of the plurality of solder balls is between at least two of the plurality of core balls.

5. The semiconductor package of claim 1, wherein the at least one core ball is on a corner portion of the redistribution substrate.

6. The semiconductor package of claim 1, wherein the at least one core ball is at a central portion of the redistribution substrate.

7. The semiconductor package of claim 1, further comprising:

a molding layer on the semiconductor chip on the redistribution substrate.

8. The semiconductor package of claim 1, wherein a diameter of the at least one core ball ranges from 5 times to 50 times a diameter of each of the plurality of solder balls.

9. The semiconductor package of claim 8, wherein the diameter of the at least one core ball ranges from 100 μm to 500 μm, and wherein the diameter of each of the plurality of solder balls ranges from 10 μm to 50 μm.

10. The semiconductor package of claim 2, wherein the core includes copper or a polymer, and wherein the peripheral portion includes a solder material.

11. The semiconductor package of claim 1, further comprising:

an underfill layer between the bottom surface of the redistribution substrate and the top surface of the package substrate, wherein the underfill layer is in a space between the core ball and the solder balls.

12. The semiconductor package of claim 1, wherein the plurality of solder balls are connected to a plurality of under bump pads on the bottom surface of the redistribution substrate, and wherein the at least one core ball is connected to a ball pad on the bottom surface of the redistribution substrate.

13. A semiconductor package comprising:

a package substrate;

a semiconductor chip on the package substrate;

a redistribution substrate between the package substrate and the semiconductor chip;

a plurality of first solder balls and a plurality of second solder balls between the redistribution substrate and the package substrate; and a plurality of under bump pads between the redistribution substrate and the first solder balls, wherein the redistribution substrate is electrically connected to the package substrate through the plurality of first solder balls, the plurality of second solder balls and the plurality of under bump pads, and wherein a diameter of each of the plurality of second solder balls is greater than a diameter of each of the plurality of first solder balls, wherein each of the second solder balls includes a peripheral portion and a core, and wherein the peripheral portion is on the core.

14. The semiconductor package of claim 13, wherein each of the plurality of second solder balls is on a corner or central portion of the redistribution substrate.

15. The semiconductor package of claim 13, wherein each of the plurality of second solder balls includes a core.

16. The semiconductor package of claim 13, wherein the diameter of each of the plurality of second solder balls ranges from 5 times to 50 times the diameter of each of the plurality of first solder balls.

17. A semiconductor package comprising:

a package substrate comprising a circuit board;

a plurality of substrate pads on a top surface of the circuit board of the package substrate;

a plurality of external pads on a bottom surface of the circuit board of the package substrate;

a semiconductor chip on the package substrate, the semiconductor chip comprising a plurality of chip pads on a bottom surface of the semiconductor chip;

a redistribution substrate between the package substrate and the semiconductor chip, the redistribution substrate electrically connected to the plurality of chip pads;

a plurality of under bump pads and a plurality of ball pads on a bottom surface of the redistribution substrate;

a plurality of solder balls on bottom surfaces of the plurality of under bump pads; and a plurality of core balls on bottom surfaces of the plurality of ball pads, wherein the plurality of solder balls and the plurality of core balls are connected to the plurality of substrate pads of the package substrate, wherein the redistribution substrate is electrically connected to the package substrate through the plurality of solder balls and the plurality of core balls, wherein the plurality of core balls are on corners of the bottom surface of the redistribution substrate, wherein each of the plurality of solder balls is between at least two of the plurality of core balls, and wherein a diameter of each of the plurality of core balls is greater than a diameter of each of the plurality of solder balls.

18. The semiconductor package of claim 17, wherein each of the plurality of core balls includes a peripheral portion and a core, and wherein the peripheral portion is on the core.

19. The semiconductor package of claim 17, wherein the diameter of each of the plurality of core balls ranges from 5 times to 50 times the diameter of each of the plurality of solder balls.

20. The semiconductor package of claim 17, wherein the plurality of substrate pads are on a top surface of the package substrate, the plurality of external pads are on a bottom surface of the package substrate, and no semiconductor chip is disposed between the top surface of the package substrate and the bottom surface of the package substrate.

* * * * *